US009929196B2

(12) United States Patent
Vilain et al.

(10) Patent No.: US 9,929,196 B2
(45) Date of Patent: Mar. 27, 2018

(54) METHOD OF MANUFACTURING AN INFRARED DETECTOR HAVING A MICRO-CAVITY AND A LOW REFRACTION INDEX STEP AT AN INTERFACE WITH A TRANSPARENT CAP, AND ASSOCIATED INFRARED DETECTOR

(71) Applicants: Ulis, Veurey Voroize (FR); Commissariat A L'Energie Atomique Et Aux Energies Alternatives, Paris (FR)

(72) Inventors: Michel Vilain, Saint Georges de Commiers (FR); Jérôme Favier, Saint Laurent du Pont (FR); Jean-Jacques Yon, Sassenage (FR); Laurent Frey, Fontaine (FR)

(73) Assignees: Ulis, Veurey Voroize (FR); Commissariat A L'Energie Atomique Et Aux Energies Alternatives, Paris (FR)

( * ) Notice: Subject to any disclaimer, the term of this patent is extended or adjusted under 35 U.S.C. 154(b) by 0 days.

(21) Appl. No.: 15/400,278

(22) Filed: Jan. 6, 2017

(65) Prior Publication Data

US 2017/0207265 A1    Jul. 20, 2017

(30) Foreign Application Priority Data

Jan. 20, 2016    (FR) .................... 16 50438

(51) Int. Cl.
*G01J 5/20* (2006.01)
*G01J 5/02* (2006.01)
(Continued)

(52) U.S. Cl.
CPC ........ *H01L 27/14618* (2013.01); *G01J 5/024* (2013.01); *G01J 5/045* (2013.01);
(Continued)

(58) Field of Classification Search
CPC .......... H01L 27/1462; H01L 27/14629; H01L 27/14649; H01L 27/14685;
(Continued)

(56) References Cited

U.S. PATENT DOCUMENTS

| 5,912,464 A | 6/1999 | Vilain et al. |
| 6,753,526 B2 * | 6/2004 | Vilain ................. B81B 7/0038 |
| | | 250/332 |

(Continued)

FOREIGN PATENT DOCUMENTS

| CN | 102935994 A | 2/2013 |
| EP | 2 447 705 A1 | 5/2012 |

(Continued)

OTHER PUBLICATIONS

J.J. Yon, et al., "Latest Improvements in Microbolometer Thin Film Packaging: Paving the Way for Low Cost Consumer Applications," *Proc. of SPIE*, vol. 9070, Infrared Technology and Applications XL, Jun. 2014, pp. 90701N-1 to 90701N-8.

(Continued)

*Primary Examiner* — Marc Armand
*Assistant Examiner* — Younes Boulghassoul
(74) *Attorney, Agent, or Firm* — Burr & Brown, PLLC

(57) ABSTRACT

A method of manufacturing a detector capable of detecting a wavelength range $[\lambda_8; \lambda_{14}]$ centered on a wavelength $\lambda_{10}$, including: forming said device on a substrate by depositing a sacrificial layer totally embedding said device; forming, on the sacrificial layer, a cap including first, second, and third optical structures transparent in said range $[\Delta_8; \lambda_{14}]$, the second and third optical structures having equivalent refraction indexes at wavelength $\lambda_{10}$ respectively greater than or equal to 3.4 and smaller than or equal to 2.3; forming a vent (Continued)

of access to the sacrificial layer through a portion of the cap, and then applying, through the vent, an etching to totally remove the sacrificial layer.

28 Claims, 16 Drawing Sheets

(51) Int. Cl.
*H01L 27/146* (2006.01)
*G01J 5/04* (2006.01)

(52) U.S. Cl.
CPC ............ *G01J 5/20* (2013.01); *H01L 27/1462* (2013.01); *H01L 27/14629* (2013.01); *H01L 27/14649* (2013.01); *H01L 27/14685* (2013.01); *H01L 27/14687* (2013.01); *G01J 2005/204* (2013.01)

(58) Field of Classification Search
CPC ........... H01L 27/14687; H01L 27/1446; H01L 27/14618; G01J 5/02; G01J 5/04; G01J 5/06; G01J 5/023; G01J 5/024; G01J 5/0235; G01J 5/045; G01J 5/08; G01J 5/0875; G01J 5/0806; G01J 5/20
USPC ........... 257/431–434; 250/332, 338.1, 338.4, 250/339.09, 339.05, 349, 394
See application file for complete search history.

(56) References Cited

U.S. PATENT DOCUMENTS

| 7,205,545 | B2 * | 4/2007 | Ouvrier-Buffet | ......... G01J 3/36 250/339.05 |
|---|---|---|---|---|
| 8,183,474 | B2 | 5/2012 | Gillot et al. | |
| 8,232,524 | B2 | 7/2012 | Vilain | |
| 8,866,082 | B2 | 10/2014 | Vilain | |
| 2003/0062480 | A1 | 4/2003 | Kanzaki | |
| 2014/0264712 | A1 | 9/2014 | Boutami et al. | |

FOREIGN PATENT DOCUMENTS

| FR | 2 752 299 A1 | 2/1998 |
|---|---|---|
| FR | 2 822 541 A1 | 9/2002 |
| FR | 2 901 264 A1 | 11/2007 |
| FR | 2 930 639 A1 | 10/2009 |
| FR | 2 936 868 A1 | 4/2010 |
| FR | 2 983 297 A1 | 5/2013 |
| WO | 2004/025694 A2 | 3/2004 |
| WO | 2013/079855 A1 | 6/2013 |
| WO | 2013/139403 A1 | 9/2013 |
| WO | 2014/100648 A1 | 6/2014 |

OTHER PUBLICATIONS

A. Carbone, et al., "Physical Properties of Amorphous Silicon-Carbon Alloys Produced by Different Techniques," *J. Mat. Res.*, vol. 5, No. 12, Dec. 1990, pp. 2877-2881.

I. Pereyra, et al., "Highly Ordered Amorphous Silicon-Carbon Alloys Obtained by RF PECVD," *Brazilian Journal of Physics*, vol. 30, No. 3, Sep. 2000, pp. 533-540.

B. Racine, et al., "Properties of Amorphous Carbon-Silicon Alloys Deposited by a High Plasma Density Source," *Journal of Applied Physics*, vol. 90, No. 10, Nov. 15, 2001, pp. 5002-5012.

A. El Khalfi, et al., "Optical Properties of Amorphous Silicon-Carbon Alloys (a-$Si_xC_{1-x}$) Deposited by RF Co-Sputtering," *Arabian Journal for Science and Engineering*, vol. 39, Issue 7, Jul. 2014, pp. 5771-5776 (Abstract Only).

French Search Report (Application No. 16.50438) dated Nov. 3, 2016.

* cited by examiner (State of the art)

(State of the art)

(State of the art)

(State of the art)

(State of the art)

(State of the art)

(State of the art)

(State of the art)

(State of the art)

(State of the art)

(State of the art)

(State of the art)

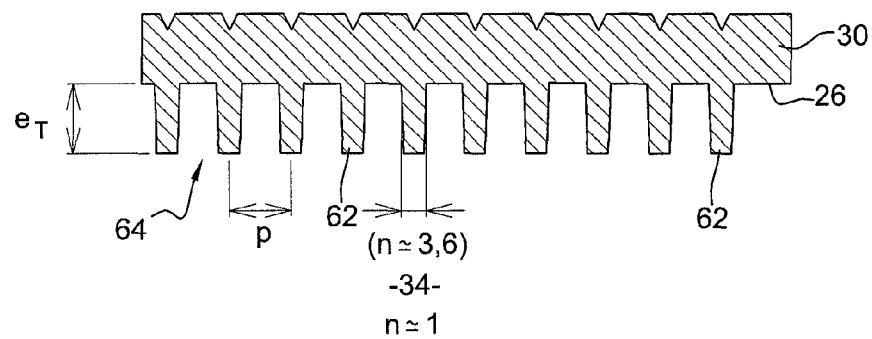
Fig. 8A
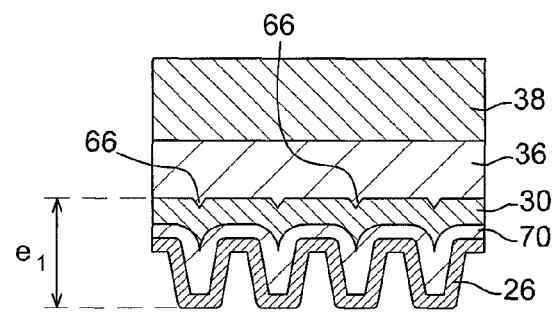
Fig. 8B
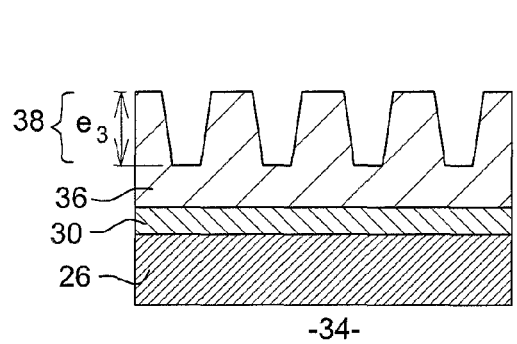 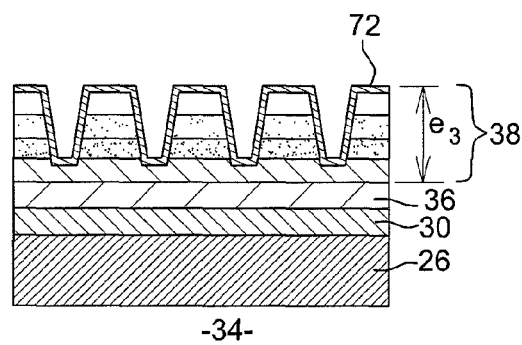
Fig. 9A  Fig. 9B

METHOD OF MANUFACTURING AN INFRARED DETECTOR HAVING A MICRO-CAVITY AND A LOW REFRACTION INDEX STEP AT AN INTERFACE WITH A TRANSPARENT CAP, AND ASSOCIATED INFRARED DETECTOR

DOMAIN OF THE INVENTION

The present invention relates to electromagnetic radiation detectors comprising an array of elementary detectors individually or collectively hermetically integrated under a controlled atmosphere. More particularly, the invention relates to such detectors designed for the detection of infrared radiation, particularly long-wavelength infrared radiation (or LWIR), in the range from 8 µm to 14 µm.

The invention finds an application in the field of thermal imagers and pyrometers, particularly bolometric detectors operating at ambient temperature.

BACKGROUND

For infrared imaging or thermography (pyrometry), it is known to use a detector operating at ambient temperature and comprising an array of elementary sensitive structures which use the variation according to temperature of a physical quantity of a material or assembly of appropriate materials. In the specific case of bolometric detectors, which are the most currently used, the physical quantity is the electric resistivity.

Such a bolometric detector usually comprises:
a substrate, typically made of silicon;
an array assembly of elementary sensitive structures, each comprising a so-called "bolometric" membrane (or "elementary bolometer") suspended above the substrate by means of suspension arms having a strong thermal resistance. Such an assembly is commonly called "sensitive retina";
electronic means for addressing in an array the elementary bolometers and for forming an electric signal from each elementary bolometer. These means are integrated to the substrate, and the substrate together with its electronic means is commonly called "read-out integrated circuit" (or ROIC);
a sealed package maintained under vacuum, or more exactly under a very low inner pressure (for example, a pressure lower than $10^{-3}$ mbar), having the sensitive retina housed therein. The package comprises a window transparent to the radiation of interest arranged opposite the sensitive retina. The package also comprises electric interconnects between the read-out integrated circuit and the outside of the package. The "vacuum" present in the package aims at making heat exchanges between the sensitive membranes and their environment via the ambient gas negligible as compared with the thermal conduction of the suspension arms.

The detector thus formed is intended to be integrated in an imaging system (for example, a camera) provided with the electronics for controlling and processing the signals supplied by the detector read-out integrated circuit, and with optics adapted to the focusing on the sensitive retina of the thermal scene to be observed. Such a system thus generates a video signal representative of the temperature reached by each of said elementary detectors, that is, a "thermal image" of the observed scene.

The manufacturing techniques, essentially of microelectronic type, implemented to manufacture the retina (chemical and physical vapor deposition, photolithography, dry or wet etching, etc.) enable to obtain manufacturing costs compatible with a massive diffusion, but the cost of the hermetic package and of the vacuum assembly operations, in other words, of the "packaging", remains significant and clearly dominates the general manufacturing cost of the detector.

With the development of room-temperature bolometric detectors, little after their commercial outbreak at the end of the 1990s, special attention has been paid to the package manufacturing in order to decrease the cost thereof. Various techniques have then been developed to limit the package cost, the first ones being so-called "Wafer Level Packaging" (WLP) techniques, where the assembly in a single operation of two substrates (a ROIC substrate comprising a plurality of sensitive retinas on one side, and a substrate comprising a plurality of windows on the other side) simultaneously forms a plurality of hermetic packages. Although such a collective manufacturing of detectors by substrate transfer enables to lower the manufacturing cost of each detector, the economical validity remains dependent on the cumulated efficiencies of the various operations, which nevertheless remain very complex to control and which require a series of high-cost equipment.

A way to partly overcome such limitations is described in document FR 2 822 541. This document of 2001, that is, a few years only after the outbreak of bolometric retinas, describes a technique of collective manufacturing of an object comprising microcavities or microcapsules formed above each detection site, or a plurality of sites simultaneously until the functional creation of vacuum by means of collective microelectronics techniques. According to this technology, called "monolithic", the tight confinement is manufactured similarly to the manufacturing of the suspended membranes of the sensitive retina by using sacrificial layers having the cap-window of the "package" formed thereon (or more precisely: microcavity, or also capsule). Unlike "WLP" techniques, there is no further need for a second window substrate having a technology which is itself complex, nor for specific techniques and materials of hermetic assembly of two substrates, usually by fluxless soldering. The specific difficulties of "WLP" techniques and the use of many techniques unusual in microelectronics are thus suppressed, with a substantially decreased total number of operations. Further, the vulnerability of sensitive structures before the integration under vacuum and the particulate contamination during these operations, that is, the associated efficiency loss or the cost of the precautions necessary to limit the effect thereof can be considered as negligible. This results in a substantial gain in terms of manufacturing cost of the "packaging" over multiple-substrate techniques.

Such a manufacturing technique having a large number of advantages, the solution disclosed in document FR 2 822 541 has been and still is the object of continuous and intensive research (see, for example, French patent application FR 2 936 868 published in 2010 or also in document "*Latest improvements in microbolometer thin film packaging: paving the way for low-cost consumer applications*» de J. J. Yon et al., Proc. *SPIE* 9070, Infrared Technology and Applications XL, June 2014, Chinese patent application CN 102935994 published in 2013, or also International patent application WO 2014/100648 published in 2014.

However, the monolithic confinement technique, in its original version of document FR 2 822 541, as well as in its improved variations, such as for example that described in document FR 2 936 868, has defects. Indeed, such a technique induces an imperfect optical transmission of the "window" portion of the capsules. The general principles of this technique and its specific limitations are now described in relation with the simplified cross-section views of FIGS. 1 and 2. In these drawings, the forming of a hermetic individual capsule is illustrated for each suspended membrane of the sensitive retina. This characteristic is however not essential herein, the capsule being for example capable of housing a plurality of membranes or of being a single structure which entirely houses the retina, the positioning, the distribution, the dimensions, the structure of the lateral walls being further likely to be very varied. Similarly, FIGS. 1 and 2 illustrate a type of mechanical support of the sensitive membranes by means of pillars. The membrane support is not an essential characteristic either, other types of mechanical support being possible, for example by means of arms embedded in the lateral walls of the hermetic packages or of reinforcing structures thereof, such as for example described in document FR 2 930 639.

FIG. 1 illustrates the final detector manufactured according to the monolithic technique, comprising substrate/read-out integrated circuit 10, the bolometric membranes 12 suspended above substrate 10 by pillars 14 also ensuring the electric continuity between the membranes and the substrate, and a microcavity 16, for example, hermetic, formed of substrate 10, of lateral walls attached to the substrate and of cap/window 20 attached to lateral walls 18.

According to the monolithic technique, all the elements just described are manufactured by successive depositions of layers of various materials, without ever transferring one element onto another, in other words, without assembling two elements previously manufactured independently from each other, and then attached to each other for example by means of a welding, a soldering, an adhesive, a molecular bonding, etc. The monolithic technique is conversely based on temporary layers of material (more commonly called "sacrificial layer"). Particularly, the monolithic manufacturing of the packages advantageously continues the monolithic manufacturing of the suspended bolometric membranes of the sensitive retina illustrated in FIG. 2A. As known, and for example as described in document FR 2 752 299, a sacrificial layer 22 is deposited on substrate 10 and the various layers forming membranes 12 are formed thereon, pillars 14 being further manufactured after the etching of openings (or "vias") in sacrificial layer 22.

For the monolithic manufacturing of package 16, a second sacrificial layer 24 is deposited on first sacrificial layer 22 and membranes 12 (FIG. 2B). A first layer 26 of a material transparent to the radiations of interest is then deposited on second sacrificial layer 24 (FIG. 2C).

According to the state of the art, the first layer of material 26 is considered of major importance in monolithic manufacturing, and should implement at least six functions:

1. it plays the role of a "hard mask" aiming at protecting the surface of the second sacrificial layer 24 during the subsequent (anisotropic) directional etching of the two sacrificial layers 22 and 24 to form lateral walls 18, the surface thereof being by definition exposed to the etching purposefully selected to etch the material of layers 22, 24;
2. it is inert to the process of removing sacrificial layers 22, 24. These layers being intended to be totally removed and to leave no trace are generally of organic nature (for example, made of polyimide) and are in this case removed by means of an oxygen-based plasma, which is particularly aggressive. As a variation, SiO-type mineral sacrificial materials may be preferred, in which case vapor-phase hydrofluoric acid (HFv), which is very aggressive for many usual materials of microbolometric assemblies, is used for the removal thereof.
3. it is optically appropriate and more specifically: transparent to let through the radiation to be detected; and naturally with no local defect (continuity, gaps, or perforations called "pinholes") or topological defect (excess thicknesses, inclusions or adhering or included particles disturbing the optical transmission, which would compromise the optical quality of window 20);
4. it is hermetic, which means that it does not have the structural defects listed in the above point, which also compromise the final tightness of the package;
5. its adherence to organic or mineral upper sacrificial layer 24 is of very good quality;
6. it enables to form openings by etching of the vents, such as described hereafter, of sub-micron dimensions to maximize the useful surface area of collection of the incident radiation energy on the area occupied by each membrane of the sensitive retina.

The manufacturing carries on (FIG. 2D) with the anisotropic etching of layer 26 and of sacrificial layers 22, 24 all the way to substrate 10, to form the separations or vias 28 where lateral walls 18 are formed, for example, a trench formed all around each membrane 12. A second layer 30 of material transparent to radiations of interest is then deposited to at least cover, or even totally fill, vias 28, thus forming lateral walls 18 delimiting the elements or groups of sensitive elements, and/or pillars for attaching cap/window 20 to substrate 10 (FIG. 2E). Second layer 30 is also considered important in the state of the art since it should fulfill or at least complete functions 2 to 6 described hereabove.

At least one opening (or "vent") 32 per package (per capsule) of small dimensions, typically having a width or diameter smaller than 0.5 μm, is then formed by directional etching through layers 26 and 30 (FIG. 2F). The inside of each package is then emptied of any sacrificial material through vent 32 by means of a complete isotropic etching of sacrificial layers 22 and 24 (FIG. 2G). Sensitive membranes 12 remain held by means of pillars 14 attached to substrate 10. Membranes 12 are then "free" but are protected from mechanical aggressions and from ambient particulate contamination since they are housed in a cavity 34 delimited by substrate 10, lateral walls 18, and upper portion 26, 30 forming the base of the future window 16.

The process carries on with the creation of vacuum in cavities 34 by placing the obtained assembly in a pumped-out enclosure, and then by depositing without breaking vacuum a third layer 36 transparent to radiations of interest, to hermetically close vents 32 (FIG. 2H). Thermal evaporation is however preferred for such a critical operation, due to the very low operating pressures both characteristic of such processes and typically eventually required inside of the capsules (lower than $10^{-3}$ mbar). Other closing architectures are for example provided in documents describing the reference technique, but the mode retained herein, described by WO 2013/079855 A1, is preferred for its simplicity and a negligible optical disturbance rate (occultation, diffusion, deflection) of its window in its portion essentially parallel to the substrate. The inner cavity 34 of each package is thus definitively sealed, and thus hermetic, at the pressure desired for the detector operation.

Optionally, to improve the optical quality of the stack of the first and second layers 26, 30 belonging to the window vertically in line with membranes 12, a fourth layer 38, also transparent to the radiation of interest, is deposited on second layer 36, for example, by thermal evaporation.

The detectors thus advantageously collectively, and thus economically, integrated under vacuum on a substrate of standard shape can then be "individualized" (separated by conventional cutting) and then integrated in their final packaging (package, support, PCB, etc.).

In practice, first layer 26, but also second layer 30 and lateral walls 18, are made of amorphous silicon ("a-Si") obtained by CVD (for "Chemical Vapor Deposition"). Indeed, the amorphous silicon thus obtained is particularly appropriate for the forming of layers 26 and 30, due to its very acceptable transparency in infrared, its simplicity of implementation, the absence of local and topological defect. Further, the adherence of amorphous silicon appears to be very satisfactory at the surface of usual sacrificial materials such as a polyimide or silicon oxide SiO, or between successive layers of same nature or related. Amorphous silicon is further characterized by an excellent selectivity over usual methods of oxygen plasma etching (ashing) of the sacrificial organic materials or under HFv for SiO-type mineral materials, and its perfect adequation to a definition by lithography and dry etching (RIE) of vias 28 and vents 32. Indeed, the latter should typically be of very small size (micron, or sub-micron for vents 32), to maximize the useful surface area of collection of the incident radiation energy on the area occupied by each elementary point of the retina. Amorphous silicon is also inert to vapor-phase hydrofluoric acid, in the case of the use of a SiO-type material as a variation of organic sacrificial layers.

Finally, layer 26 should be mechanically resistant, non-porous, and perfectly adherent to the materials and structure preformed at the surface of substrate 10. The CVD amorphous silicon adds to these qualities a specific ability to cover depressions of high form factor (depth-to-width) of patterns 28, "conformally", that is, with no continuity flaw and with a practically constant thickness. Actually, this material is naturally capable of fulfilling at a limited cost all the previously-specified functions and constraints, and no material better suited to the forming at least of the base of window 16 in the present context is known.

Third layer 36 is usually obtained by evaporation of germanium (Ge). The advantage of evaporated germanium, well known in the forming of conventional multiple-layers intended for the antireflection and/or bandpass treatments of thick windows usually implemented in the field of all detectors operating in infrared, is its high optical index (4-4.2) and its very good transparency. Further, and decisively, the hermetic closing of vents 32 by evaporation of germanium is recognized as satisfactory.

Fourth layer 38 is made of zinc sulfide (ZnS). Zinc sulfide is also commonly used in the field of infrared optical multilayers for its relatively low refraction index (2.2-2.3) despite its limitations in terms of mechanical constants (hardness, abrasion resistance) and of thermal stability, which is a problem beyond 300° C.

The material optical structure of windows of the state of the art is thus formed of an assembly of three basic materials (a-Si, Ge, ZnS), the selection of which is essentially dictated by a complex tradeoff induced by the monolithic manufacturing technique.

However, the thickness of the various layers present also defines the transmittance of the window and particularly the quality of this transmittance. More particularly, a transmittance between 8 and 14 µm is desired for thermal infrared (LWIR), which:

has a high average value in the waveband of interest; and has minimum variations in said band, or in other words the "flattest" possible transmittance in said band.

In most cases, a criterion of wavelength filtering outside of the band of interest adds to these two criteria, which impact the sensitivity and the linearity of the detector response. For example, in the case of a LWIR bolometric detection, a transmittance which clearly and deeply decreases at least on the side of short wavelengths (<8 µm), the window thus playing the role of a low-pass filter greatly improving the quality of the detection.

It is possible to simultaneously fulfill these various spectral features when the designer admits the use of a "thick" optical stack formed of many stacked layers having a total optical thickness way beyond the central wavelength $\lambda_{10}$ of the band of interest. Indeed, the highly complex multiple interferences of such stacks provide many degrees of liberty for the adjustment of the transmittance spectrum, so that there are no predefined criteria, principles, or laws (except for a negligible optical absorption, in the band of interest of all the layers used for their respective thicknesses) to obtain the best tradeoff. Such a search for a specific transmittance spectrum actually comes under "random" digital simulation and the designer's know-how.

In the designer of simple stacks limited to a few layers only, which is typical of and specific to the present context, the designer should favor the first criterion of high transmittance in the band of interest, by means of simplified design rules usual in the field of multilayer filters. In particular, he/she is led, for each of the layers made of a material of optical (or refraction) index $n_i$, to preferring a thickness close to $p_i \cdot \lambda_{10}/4n_i$, where $p_i$ is an integer and $\lambda_{10}$ is a wavelength of the band of interest having the multilayer tuned thereto (usually the central wavelength of said band). In the state of the art, such preferred criteria lead to retaining thicknesses respectively in the range from 0.6 to 1 µm for amorphous silicon (sum of layers 26 and 30), from 1 to 2 µm for germanium (layer 36), of approximately 1.2 µM for zinc sulfide (layer 38), to form structures adapted to a detection between 8 µm and 14 µm.

An example of a transmittance spectrum (ratio I/IO, IO being the intensity of a radiation of normal incidence on layer 38 and I being the intensity of the transmitted radiation coming out beyond layer 26) of the window alone is illustrated in FIG. 3A with thicknesses selected according to rule $p_i \cdot \lambda_{10}/4n_i$, resulting in a stack of 0.7 µm of a-Si (n=3.65), of 0.6 µm of Ge (n=4.2), and of 1.2 µm of ZnS (n=2.2), that is, three quarter-wave layers ($p_i$=1) tuned to 10 µm. It can be observed that the average transmittance over the [8; 14 µm] band of interest is close to 83%. All the other thickness combinations, with a quarter-wave (or multi-quarter wave, that is, with $p_i$>1) tuning or non-tuned, result in non-competitive spectra, that is, spectra having a greater intra-band amplitude dispersion or/and having a smaller average value.

To make the issue even more complex, the above thicknesses, considered as the best regarding the "$p_i \cdot \lambda_{10}/4n_i$" rule, are not adapted to monolithic manufacturing. In particular, the 0.7-µm thickness of a-Si (layer 26+30) may be insufficient to form lateral walls 18 having a satisfactory mechanical resistance. Similarly, a 0.6-µm thickness of Ge of third layer 36 is not adequate to safely close vents 32, so that a much larger thickness beyond 1 µm is preferable for this layer. The transmittance should thus be "degraded" regarding the "$p_i \cdot \lambda_{10}/4n_i$" rule to fully satisfy the mechanical and tightness constraints. FIG. 3B thus illustrates an example of transmittance of a window satisfying said constraints, formed of 0.8 μm of a-Si, of 1.6 μm of Ge, and of 1.2 μm of ZnS. A transmittance spectrum well positioned between 8 and 14 μm, but which has significantly stronger oscillations and a substantially less favorable average (~73%) than the "ideal spectrum" of FIG. 3A, is thus obtained.

Further, since in such a simplified optical context, the low-pass filtering cannot be optimized together with the transmittance in the band of interest, there remains a risk of too high a sensitivity to short wavelengths (for example, below 8 μm for the LWIR band), due to possible "unfortunate" matches of the respective maximum values of the spectral transmittance of the window and of the absorption spectrum of the sensitive membrane. Indeed, incidental strong radiations at wavelengths smaller than 8 μm are for example likely to induce a problematical electric drift of the sensitive retina. In particular, the spectrum of FIG. 3A for example exhibits a plurality of narrow peaks of very high transmittance, which are thus particularly harmful, in the band under 7 μm where a very low transmittance is preferred.

All these issues impose taking specific measures, for example, in terms of transmittance of the window and/or of mechanical resistance.

As a summary, the adjustment of the transmittance in a band of a package manufactured according to the monolithic technique is very complex since there exists a large number of constraints of different nature to be taken into account. Of course, although the monolithic manufacturing of a hermetic package has been illustrated hereabove in relation with a bolometric infrared detector, this issue also arises for any type of detector having its package manufactured according to the monolithic technique.

SUMMARY OF THE SPECIFICATION

The present invention thus aims at providing a method of monolithic manufacturing of a hermetic package, in particular housing a detection device, enabling to set the transmittance of the cap/window of this package to substantially higher values.

To achieve this, the invention aims at a method of manufacturing a detector capable of detecting a wavelength range $[\lambda_8; \lambda_{14}]$ centered on a wavelength $\lambda_{10}$, the detector comprising a detection device capable of detecting said range $[\lambda_8; \lambda_{14}]$ and a hermetic package under a predetermined pressure having said device housed therein, said package being formed of a substrate, of lateral walls attached to the substrate and of an upper cap attached to the lateral walls and comprising a portion vertically in line with the device which is transparent in said range $[\lambda_8; \lambda_{14}]$, the method comprising:
forming said device on the substrate, said forming comprising depositing a sacrificial layer totally embedding said device;
forming the cap on the sacrificial layer, said cap being formed of a stack of first, second, and third optical structures transparent in said range $[\lambda_8; \lambda_{14}]$, the second and third optical structures having equivalent refraction indexes at wavelength $\lambda_{10}$ respectively greater than or equal to 3.4 and smaller than or equal to 2.3;
after the forming of a portion of the cap comprising at least the first optical structure, forming a vent of access to the sacrificial layer through said portion of the cap, and then applying, through the vent, an etching to totally remove the sacrificial layer.

According to the invention:
the optical thickness of the first optical structure is greater than or equal to $\lambda_{10}/10$;
the equivalent refraction index $n_{eq}^1$ at wavelength $\lambda_{10}$ of the first optical structure is smaller than or equal to 2.6; and
the surface of the first optical structure formed on the sacrificial layer is inert to the etching implemented to remove the sacrificial layer.

In other words, in the state of the art, a first layer of amorphous silicon obtained by CVD is deposited on the sacrificial layer and a second layer of the same silicon is deposited on the first layer for the above-discussed reasons. Now, this material makes the setting of the window transmittance difficult right away due to its high refraction index (equal, in practice, to 3.4±10% in a LWIR band), which forms with the inner vacuum of the package an interface of large index step. The forming of an optical structure having a low equivalent refraction index (explained hereafter), in particular smaller than or equal to 2.6, minimizes optical losses due to this interface. On reading of the previously-discussed issue, what should be understood of a first optical structure only made of amorphous silicon obtained by CVD is that it also is a significant technological limitation, despite its many remarkable qualities. However, in the state of the art, the first optical layer made of CVD a-Si responds to so many complex constraints that searching for an alternative intended to overcome this limitation without generating new insuperable technological problems appears to be pointless. Indeed, this choice has never been questioned up to this invention.

According to an embodiment:
the forming of the first optical structure on the sacrificial layer comprises:
depositing a first layer of material on the sacrificial layer, the first layer being entirely made of a material inert to the predetermined etching; and
forming a second layer of material on the first layer;
and the thicknesses and the equivalent refraction indexes at wavelength $\lambda_{10}$ of the first layer and of the second layer verify relation:

$$\frac{n_{s1} \cdot e_{s1} + n_{s2} \cdot e_{s2}}{e_{s1} + e_{s2}} \leq 2.6$$

in which expression:
$n_{s1}$ and $n_{s2}$ respectively are the equivalent refraction indexes at wavelength $\lambda_{10}$ of the first layer and of the second layer; and
$e_{s1}$ and $e_{s2}$ respectively are the geometric thicknesses of the first layer and of the second layer.

In other words, the first structure may be formed of a plurality of layers, each made of a single material.

According to an embodiment:
the predetermined isotropic etching is an etching based on hydrofluoric acid vapor (HFv);
and the material inert to the predetermined etching is amorphous silicon (a-Si) or amorphous carbon (a-C) or an amorphous alloy of carbon (C) and of silicon (Si) of a-Si$_x$C$_{(1-x)}$ type where $0<x<1$, or an amorphous alloy of silicon (Si) et and of germanium (Ge) of a-Si$_x$Ge$_{(1-x)}$ type, where $0<x<1$.

As a variation:
the predetermined isotropic etching is a dry oxidizing etching;

and the material inert to the predetermined etching is amorphous silicon (a-Si) or an amorphous alloy of carbon (C) and of silicon (Si) of a-Si$_x$C$_{(1-x)}$ type where 0.05≤x<1, or an amorphous alloy of silicon (Si) et and of germanium (Ge) of a-Si$_x$Ge$_{(1-x)}$ type, where 0<x<1.

In other words, the materials enable to fulfill all the constraints previously described in relation with amorphous silicon deposited by CVD.

Particularly relating to amorphous silicon, for example, in the case of a first optical structure made of this material, the deposition is a plasma-enhanced chemical vapor deposition (or PECVD), this type of silicon having a refraction index smaller than that of amorphous silicon deposited by CVD.

According to a specific variation, the second layer of the first optical structure is totally made of zinc sulfide (ZnS), which enables to improve the transmittance of the window.

According to an embodiment, the forming of the first optical structure comprises forming a periodic grating of depressions in the sacrificial layer, the pitch or the period of the periodic grating being smaller than $$\frac{\lambda_{10}}{3},$$

resulting in at least partially filling the depression of said grating.

In other words, the first optical structure is thus at least partly formed of a periodic grating texturing corresponding to the "molding" of the depressions formed in the sacrificial layer, by means of one or of a plurality of materials, at least the first thereof being inert to the etching intended to remove said sacrificial layer. For example, this forming comprises depositing a layer made of an amorphous alloy of silicon (Si) and of germanium (Ge) of a-Si$_x$Ge$_{(1-x)}$ type, where 0<x<1, to at least partially fill the depressions of said grating.

According to an embodiment, the first optical structure has an optical thickness $e_1$ verifying relation $$e_1 = \frac{\lambda_{10}}{4}.$$

According to an embodiment, the second optical structure is entirely made of (Ge) or of a stack of a layer of amorphous silicon (a-Si) and of a layer of germanium (Ge).

According to an embodiment, the second optical structure has an optical thickness $e_2$ verifying relation $$e_2 = p_2 \times \frac{\lambda_{10}}{4},$$

in which expression $p_2$=1, 2, or 4.

According to an embodiment, the total geometric thickness of the first, second, and third optical structures is smaller than or equal $$\frac{\lambda_{10}}{2}.$$

According to an embodiment, the third optical structure is entirely made of zinc sulfide (ZnS).

According to an embodiment, the third optical structure is entirely made of an amorphous alloy of carbon (C) and of silicon (Si) of a-Si$_x$C$_{(1-x)}$ type, where 0<x<1, particularly x≤0.4.

According to an embodiment, the third optical structure is formed by the etching of a periodic grating of depressions into the thickness of the materials forming the second optical structure. In particular, the third structure is at least partly formed by the etching of a periodic grating of depressions into at least one layer made of an alloy of a-Si$_x$C$_{(1-x)}$, or a-Si$_x$Ge(1−x) type, where 0<x<1, particularly x≤0.4.

According to an embodiment, the third structure is formed by etching of a periodic grating of depressions into the thickness of the materials forming the second optical structure, followed by the deposition of at least one layer made of amorphous carbon (a-C) or of an amorphous alloy of carbon (C) and of silicon (Si) of a-Si$_x$C$_{(1-x)}$ type, where 0<x<1, particularly x≤0.4, and preferably x≥0.05.

According to an embodiment, the third optical structure has an optical thickness $e_3$ verifying relation $$e_3 = \frac{\lambda_{10}}{4}.$$

According to an embodiment, the detection device comprises at least one bolometric membrane capable of absorbing part of the radiation in said range [$\lambda_8$; $\lambda_{14}$] and suspended above a metal reflector, the method comprising:
  determining variations of the absorbance of said membrane according to said optical structure of said window;
  determining ranges of values for the equivalent refraction index $n_{eq}^1$ of the first optical structure of the window, the distance between the bolometric membrane and the metal reflector and/or the distance between the bolometric membrane and the window while taking into account manufacturing and/or operating constraints; and
  selecting, in said determined ranges, a quadruplet inducing an average absorbance greater than 90% of said membrane in said range [$\lambda_8$; $\lambda_{14}$];
  said quadruplet at least comprising the geometric thickness, the equivalent refraction index $n_{eq}^1$ of the first optical structure of the window, the distance between the bolometric membrane and the metal reflector, and the distance between the bolometric membrane and the window.

According to an embodiment, the forming of the first optical structure comprises forming a periodic grating of patterns in its surface in contact with the sacrificial layer, and the grating filling factor, the distance between the membrane and the metal reflector, and the distance between the membrane and the cap are selected to set the average absorption of the membrane in said range [$\lambda_8$; $\lambda_{14}$] to a value greater than 90%.

In particular, the patterns form pads or a grid of amorphous silicon (a-Si), the refraction index of amorphous silicon (a-Si) being in the range from 0.9×3.4, to 1.1×3.4, the period of the grating being in the range from 1 to 3 µm, and:
  distance hP between the membrane and the cap is in the range from 1 µm to 1.5 µm;
  distance hR between the membrane and the reflector is in the range from 1.8 µm to 2.3 µm;
  depth $e_T$ of the grating pads is in the range from 1.8 µm to 2.1 µm; and filling factor ff of the grating of pads is in the range from 40% to 65% and filling factor ff of the grid is in the range from 15% to 35%.

As a variation, the grating patterns form pads or a grid of amorphous silicon (a-Si), the refraction index of amorphous silicon (a-Si) being in the range from 0.9×3.4, to 1.1×3.4, the grating period being in the range from 1 to 3 µm, and:
  distance hP between the membrane and the cap is in the range from 1.5 µm to 2 µm;
  distance hR between the membrane and the reflector is in the range from 1.6 µm to 2 µm;
  depth $e_T$ of the grating pads is in the range from 1.8 µm to 2.1 µm; and
  filling factor ff of the grating of pads is in the range from 30% to 50% and filling factor ff of the grid is in the range from 10% to 25%.

As a variation, the grating patterns form pads or a grid of amorphous silicon (a-Si), the refraction index of amorphous silicon (a-Si) being in the range from 0.9×3.4, to 1.1×3.4, the grating period being in the range from 1 to 3 µm, and:
  distance hP between the membrane and the cap is in the range from 2 µm to 3 µm;
  distance hR between the membrane and the reflector is in the range from 1.4 µm to 1.8 µm;
  depth $e_T$ of the grating pads is in the range from 1.5 µm to 2.1 µm; and
  filling factor ff of the grating of pads is in the range from 25% to 40% and filling factor ff of the grid is in the range from 5% to 20%.

In particular, for a first non-structured optical structure formed of one or a plurality of layers of material:
  distance hP between the membrane and the cap is in the range from 1 µm to 1.5 µm;
  distance hR between the membrane and the reflector is in the range from 1.8 µm to 2.3 µm;
  geometric thickness $e_1$ of the first optical structure is in the range from 1.8 µm to 2.1 µm; and
  equivalent refraction index $n_{eq}^1$ of the first optical structure is in the range from 1.45 to 1.80.

As a variation, for a first non-structured optical structure formed of one or a plurality of layers of material:
  distance hP between the membrane and the cap is in the range from 1 µm to 2.5 µm;
  distance hR between the membrane and the reflector is in the range from 1.6 µm to 2 µm;
  geometric thickness $e_1$ of the first optical structure is in the range from 1.8 µm to 2.1 µm; and
  equivalent refraction index $n_{eq}^1$ of the first optical structure is in the range from 1.35 to 1.60.

As a variation, for a first non-structured optical structure formed of one or a plurality of layers of material:
  distance hP between the membrane and the cap is in the range from 2 µm to 3 µm;
  distance hR between the membrane and the reflector is in the range from 1.5 µm to 2.1 µm;
  geometric thickness $e_1$ of the first optical structure is in the range from 1.5 µm to 2.1 µm; and
  equivalent refraction index $n_{eq}^1$ of the first optical structure is in the range from 1.30 to 1.50.

A first optical structure manufactured according to these parameters provides an absorption in the suspended membrane between the cap and the reflector greater than or equal to 95% in the [8; 14 µm] radiation range.

According to an embodiment, the bolometric membrane is formed of:
  a titanium nitride (TiN) layer, having a 380-Ohm/square sheet resistance, a 8-nm thickness, and indexes n=10.5 and k=16, at a 10-µm wavelength; and
  having an amorphous silicon (a-Si) layer, with a 200-nm thickness and indexes n=3.42 and k=0 at 10 µm, deposited thereon.

The invention also aims at a detector capable of detecting a wavelength range [$\lambda_8$; $\lambda_{14}$] centered on a wavelength $\lambda_{10}$, the detector comprising a detection device capable of detecting said range [$\lambda_8$; $\lambda_{14}$] and a hermetic package under a predetermined pressure having said device housed therein, said package being formed of a substrate, of lateral walls attached to the substrate, and of an upper cap attached to the lateral walls and comprising a portion vertically in line with the device which is transparent in said range [$\lambda_8$; $\lambda_{14}$], said cap being formed of a stack of first, second and third optical structures transparent in said range [$\lambda_8$; $\lambda_{14}$], the second and the third optical structures having equivalent refraction indexes at wavelength $\lambda_{10}$ respectively greater than or equal to 3.4 and smaller than or equal to 2.3, and wherein;
  the optical thickness of the first optical structure is greater than or equal to $\lambda_{10}/10$;
  and the equivalent refraction index $n_{eq}^1$ at wavelength $\lambda_{10}$ of the first optical structure is smaller than or equal to 2.6.

Notations and Definitions

In the present document, the following notations and definitions are used:
  "layer of material" or "layer" designates a material, such as for example obtained by a deposition technique of microelectronics (CVD, PECVD, PVD, etc.), defined between two essentially parallel opposite surfaces (not necessarily planar).
  "Thickness of a layer of material" designates the geometric distance between the two surfaces, particularly along an axis orthogonal to the substrate. A layer of material may be made of a single material or of a stack of a plurality of different materials. A surface of a layer of material may or not be textured. With no other explicit or contextual specification, a layer of material refers to an element made of a single material having non-textured surfaces;
  term "transmittance" (T) only applies to the complete structure of the cap or window and designates the spectral ratio of the transmitted intensity to the incident intensity measured in the infinite half-spaces on either side of the window, far from it. The integrated (or average) transmittance in the band of interest, defined by the following expression, is here further particularly considered:

$$\frac{1}{\lambda_{14} - \lambda_8} \int_{\lambda_8}^{\lambda_{14}} T(\lambda) d\lambda$$

with no convolution with the spectral energy density of the thermal scene which is to be observed in the final application. Indeed, the law of "black body" radiation would substantially favor in the LWIR band the low portion of the [8; 14 µm] band of interest in terms of integrated energy, when a thermal scene in the vicinity of 300 K is considered, and thus, all the more as the scene is hot.

the "transparency" of a material or of an optical structure indicates that the use of this material or structure in the context of the invention (that is, according to the envisaged thickness of material and/or to the way in which the structure is formed) is associated with a negligible energy loss by absorption in the band of interest, and more specifically with less than 2% of absorption loss on the integrated transmittance such as previously defined.

the "refraction index" refers to the refraction index of a single material at the central wavelength of the wavelength range of interest, particularly the values referenced in "*Handbook of Optical Materials (Laser & Optical Science & Technology*", Marvin J. Weber, CRC Press, First Edition, September 2002, ISBN-13: 978-0849335129;

the "equivalent refraction index" refers to the average weighted index of a stack of layers, each made of a single material, that is, index $n_{eq}=(\Sigma_i n_i \cdot e_i)/(\Sigma_i e_i)$, where $n_i$ is the refraction index of the material of a layer and e is the geometric thickness thereof. When a layer is made of a single material, the equivalent refraction index is thus equal to the refraction index of the material. When a layer is textured, its refraction index $n_i$ is replaced with the effective refraction index;

"effective refraction index" refers to an equivalent refraction index of a layer of material textured between two parallel planes limiting the textured volume. The "effective refraction index" of such a textured structure may for example be approximated by expression $n_{eff}=(1/v \cdot \int_v n_{dv}^2 \cdot dv)^{0.5}$, where v is the volume per surface area unit (comprising at least one complete texturing period in the two directions orthogonal to the optical axis of the system) between the two limiting planes, and $n_{dv}$ is the local refraction index of the material forming a specific infinitesimal volume dv within this volume. In the framework of a texturing comprising juxtaposed periodic patterns made of a material having a refraction index $n_1$ separated by a material or medium having a refraction index $n_2$, the effective refraction index may be estimated by $n_{eff}=(ff \cdot n_1^2+(1-ff) \cdot n_2^2)^{1/2}$, where ff is the filling rate of the periodic grating. This expression can be reduced to $n_{eff}=(ff \cdot n^2+(1-ff))^{1/2}$ when the medium separating the patterns is air (for example, the outer medium of the object) or the vacuum typically present in the hermetic microcavity (for example, when the texturing concerns the inner surface of the cavity);

"optical thickness" designates for a layer of material the optical path under a normal incidence, that is, product $n_i \cdot e_i$ of the equivalent refraction index of the layer by geometric thickness $e_i$ of this layer; notation "$e_i$" indifferently designates the geometric thickness or the optical thickness, the valid sense being explicitly assigned for each occurrence;

"optical structure" designates an assembly of finite thicknesses formed of a stack of one or a plurality of layers of material, planar or textured in a periodic grating in the plane of the layers, which in practice behaves in a way, in terms of propagation of the electromagnetic waves in the band of interest, undiscernible from a single layer having a refraction index equal to the equivalent refraction index of this assembly. Such a behavior is for example obtained when the real or effective refraction indexes of the elements forming the assembly are close to one another, and particularly differ by less than 15%, or when the optical thickness of one of the layers of this assembly is insufficient to significantly disturb this behavior at a wavelength λ, that is, typically smaller than λ/30. For example, the assembly formed by the stacking of a textured structure of effective index $n_{eff}$ for a geometric thickness $e_1$ and of an essentially planar layer of material having an equivalent index $n_2$ of geometric thickness $e_2$ results in efficiently approximating, at least in the specified conditions of proximity of the index values, the equivalent index of the assembly according to expression:

$$n_{eq}=(e_1 \cdot n_{eff}+e_2 \cdot n_1)/(e_1+e_2)$$

"sub-wavelength dimension" designates a quantity smaller than the lower limit of the band of interest;

"material inert to etching" designates a material which is very little or not etched by an etching intended to etch another material, for example, a material verifying V(material)/V(other material)<1/10, preferably smaller than 1/100 and preferably still smaller than 1/1,000, where V(material) is the speed of etching of the material, and V(other material) is the speed of etching of the other material;

term "on" or "above", or also "stacked", that is, a second layer "on" a first layer, means "formed afterwards, in structural continuity", unless otherwise specified.

BRIEF DESCRIPTION OF THE DRAWINGS

The present invention will be better understood on reading of the following description provided as an example only in relation with the accompanying drawings, where the same reference numerals designate the same or equivalent elements, among which:

FIGS. 8A and 8B are a simplified cross-section view of first textured layers obtained according to the method of FIGS. 7A to 7E;

FIGS. 9A and 9B are simplified cross-section views of third optical structures of the cap/window;

DETAILED DESCRIPTION OF THE SPECIFICATION

The monolithic manufacturing of a package, for example, hermetic, of a bolometric detector with a suspended membrane intended to detect the [8; 14 µm] waveband will now be described. As for the previously-described state of the art, the shape, the geometry, the number of membranes per package, etc. are not essential characteristics in the context of the invention. The manufacturing steps are identical to those previously described, unless otherwise mentioned.

The invention particularly comprises monolithically manufacturing for the cap/window of the package a first optical structure of optical thickness $e_1$ on the sacrificial layer, transparent to the radiation of interest, having an equivalent refraction index $n_{eq}^1$ smaller than or equal to 2.6, and preferably greater than or equal to 1.3. Preferably, the optical thickness is greater than 0.5 µm and preferably close to or equal to $\lambda_{10}/4$, where $\lambda_{10}$ is the central wavelength of the band of interest, for example 10 µm or 11 µm for the LWIR detection.

First and second embodiments for which the window manufacturing is only performed by means of successive depositions of layers of materials will first be detailed, the setting of the different refraction indexes and equivalent refraction indexes being based on the selection of the deposited materials and of the thicknesses thereof. Third and fourth embodiments further using texturings to form the first optical structure in order to obtain an additional refraction index setting parameter will then be detailed. In a fifth embodiment, an optimization of the first optical structure and of the location of the membrane relative to the capsule and to a reflector arranged on the read-out integrated circuit will be detailed.

A. Monolithic Manufacturing by Successive Depositions

First Embodiment

The first embodiment illustrated in relation with FIGS. 4A to 4F especially comprises replacing the first layer of the state of the art entirely made of CVD a-Si with a first optical structure comprising a layer of ZnS, or of any other material having an index adapted to the object and capable of being produced according to a method adapted to the context of microelectronics. This first optical structure thus has a composition which defines the desired equivalent refraction index smaller than or equal to 2.6.

Figure 1:
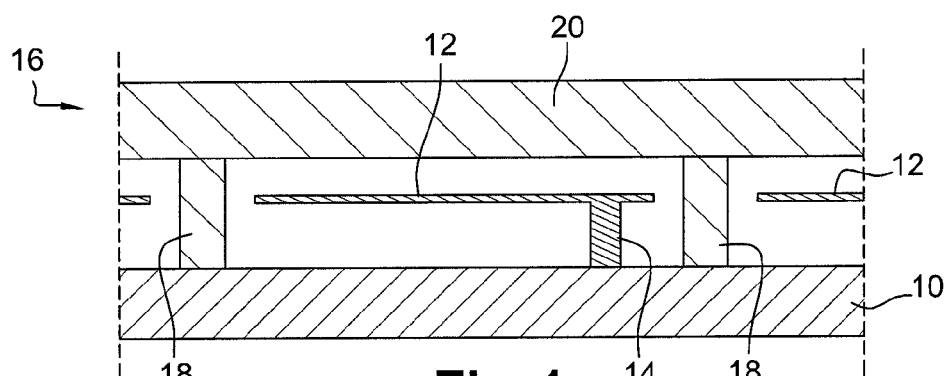
FIG. 1 is a simplified cross-section view of a bolometric membrane of an infrared detector housed in an individual package according to the state of the art.
Figure 2A:
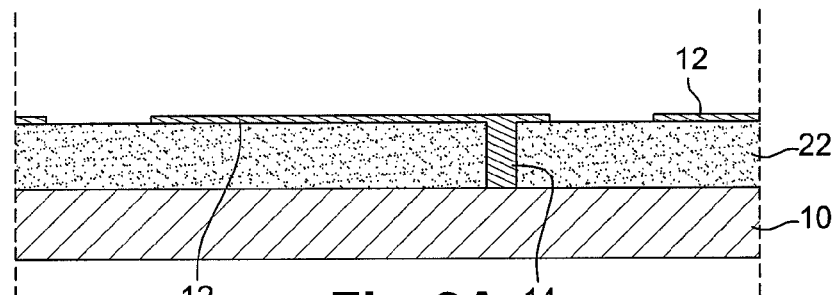
FIGS. 2A to 2I are simplified cross-section views illustrating a monolithic manufacturing of the detector of FIG. 1.
Figure 2B:
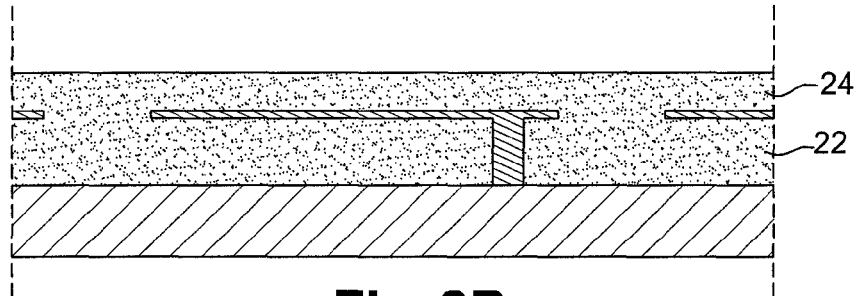
Figure 2C:
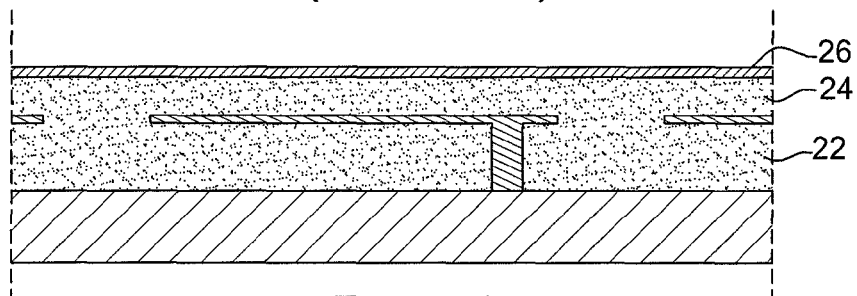
Figure 2D:
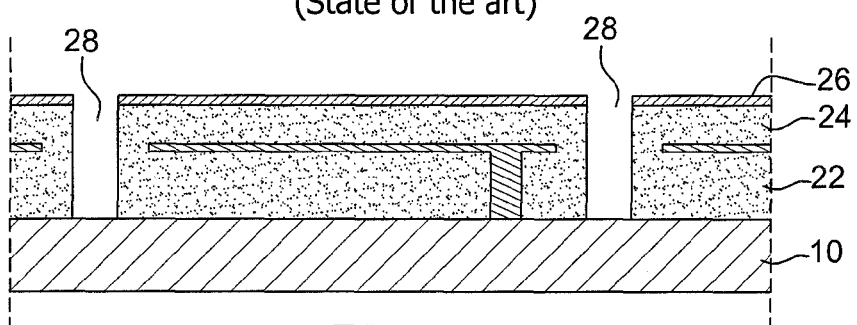
Figure 2E:
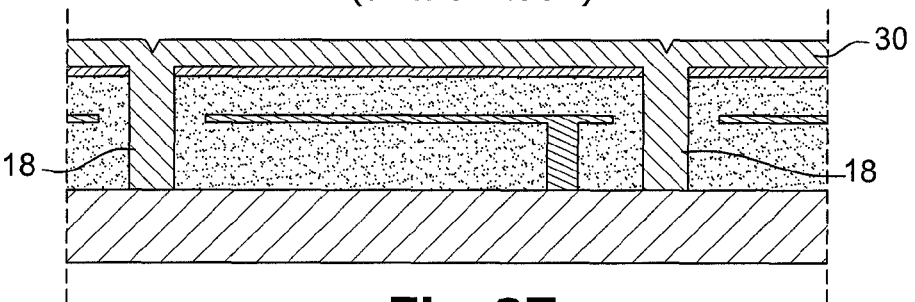
Figure 2F:
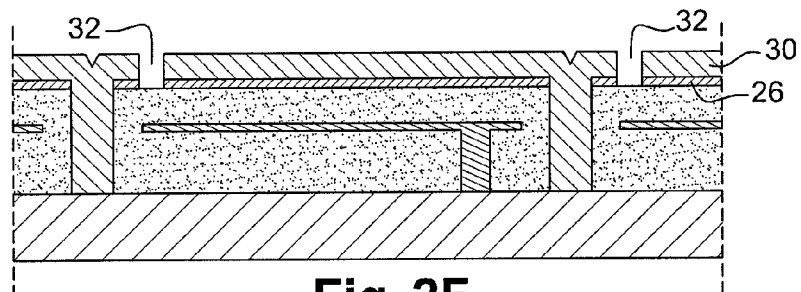
Figure 2G:
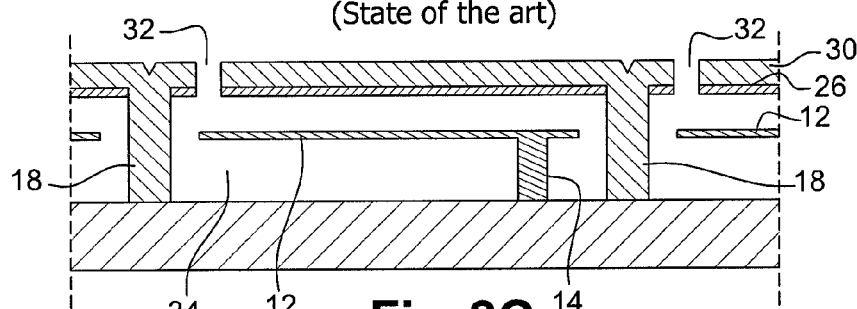
Figure 2H:
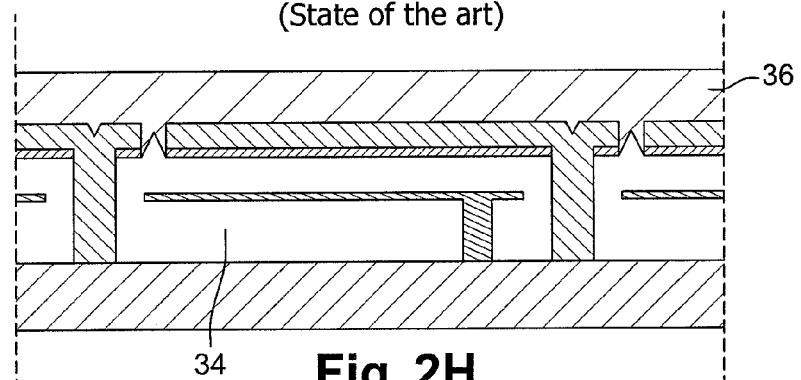

The monolithic package manufacturing method for example starts by carrying on the method of monolithic manufacturing of the sensitive retina such as described in relation with FIG. 2A, by depositing on second sacrificial layer 24 a first layer 40A of a liner, (FIG. 4A) essentially playing the role of a hard mask for the anisotropic etching of the sacrificial layers, and of protection of the ZnS layer (on its lower surface) subsequently deposited, during the etching and the removal of sacrificial layers 22, 24. Liner 40A also has the function of ensuring the adherence, the physical continuity, and the mechanical stability of the first optical structure. Particularly, its thickness is selected to ensure these functions while being limited, the tightness thus not being the object targeted herein.

In a first variation, layer 40A is a layer having a geometric thickness in the range from 0.05 to 0.1 µm of amorphous silicon (a-Si). Preferably, the a-Si layer is obtained by means of a deposition at low temperature (below 300° C.), particularly a plasma-enhanced CVD (PECVD), which provides an amorphous silicon having a refraction index smaller than that of crystalline silicon (~3.4) in the LWIR band, so that layer 40A is less disturbing for the equivalent refraction index of the first optical structure. It is in particular advantageous to use an amorphous silicon layer obtained by methods of essentially non-thermal dissociation of silane ($SiH_4$) typically below 300° C., or even at ambient temperature. Glow Discharge (GD) activation methods, also called PECVD, or the like, generally but not necessarily carried out in a hydrogen dilution, enable to access specific forms of silicon (usually called a-Si:H) at a low refraction index in the order of 2.5-2.6 in long-wave infrared (LWIR).

Advantageously, though optionally, a dense layer having a low hydrogen content, for example, 20 nm of CVD a-Si, is first deposited on the sacrificial layer. Potential hydrogen effusions adversely affecting the quality of the desired vacuum in the package are thus limited to what is generated by the known technique. It should be noted that since this layer is very thin, it does not disturb the optical behavior of the structure described hereafter.

In a second variation, liner layer a-Si may however be entirely obtained by means of a CVD, having a limited thickness which enables to obtain the equivalent index in the desired range for the first optical structure.

A ZnS layer 40B is then deposited (FIG. 4B) on first layer 40A, particularly by evaporation, with a thickness of at least 0.2 µm, to form with layer 40A a first optical structure 40 having an optical thickness preferably close to $\lambda_{10}/4$. For example, to optically complete a layer 40A formed of 0.1 µm of CVD a-Si (n~3.6), layer 40B has a thickness greater than or equal to 0.2 µm. For example, a geometric thickness of ZnS in the range from 0.8 µm to 1 µm enables to obtain a first optical structure 40 having a substantially quarter-wave equivalent refraction index $n_{eq}^1$~2.45 at 10 µm.

Apart from an index relatively well adapted to an efficient optical role, ZnS has none of the features necessary or useful for the construction of hermetic packages, in particular small dimensions (below 30 µm, for example) as is typically envisaged. In other words, the first optical structure 40 of the invention is not a hermetic layer, the tightness being ensured by the upper layers.

Figure 4A:
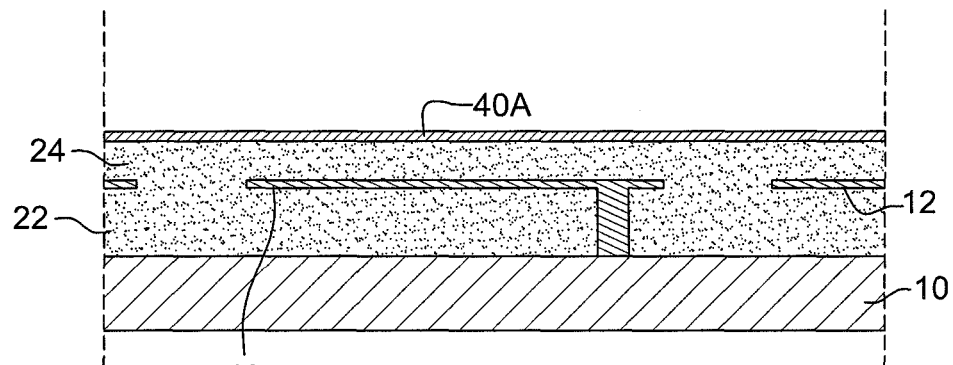
FIGS. 4A to 4F are simplified cross-section views of a method of monolithic manufacturing of a cap/window according to a first embodiment according to the invention.
Figure 4B:
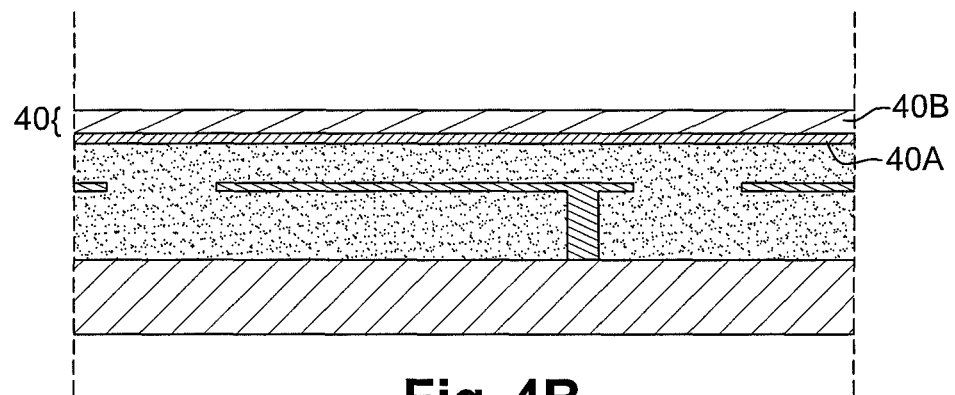
Figure 4C:
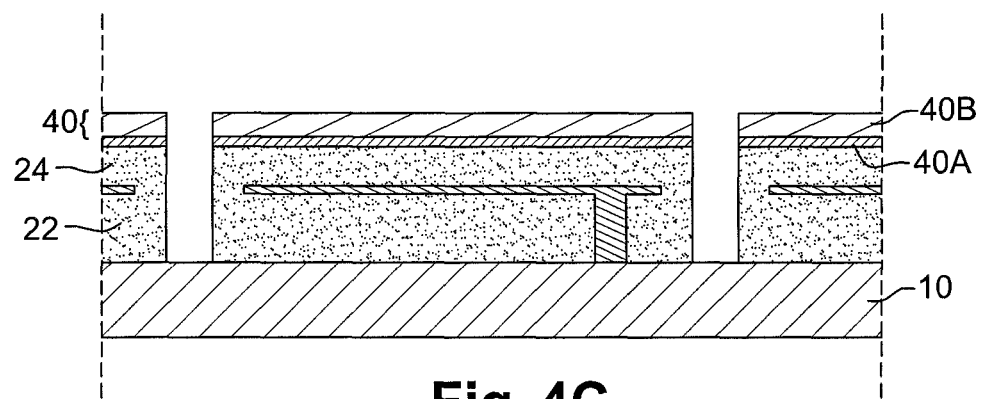
Figure 4D:
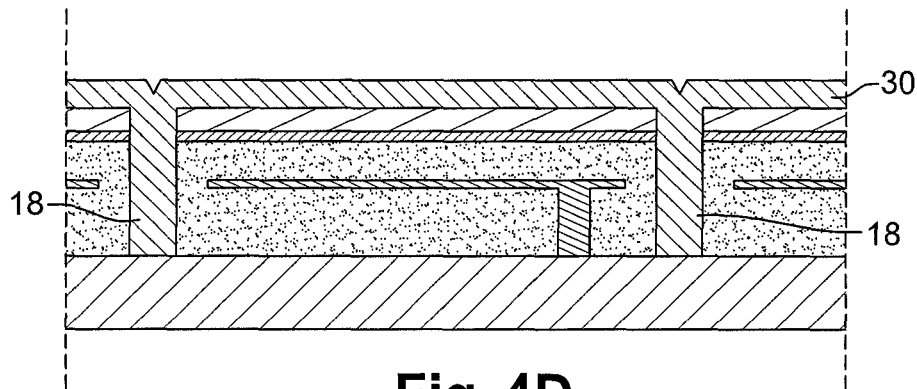
Figure 4E:
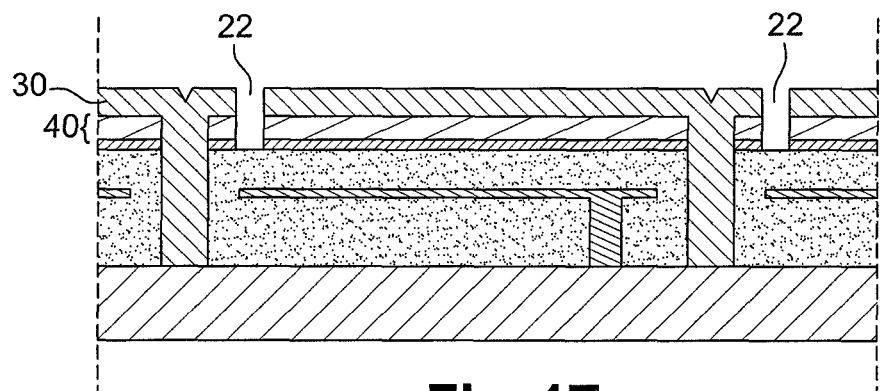
Figure 4F:
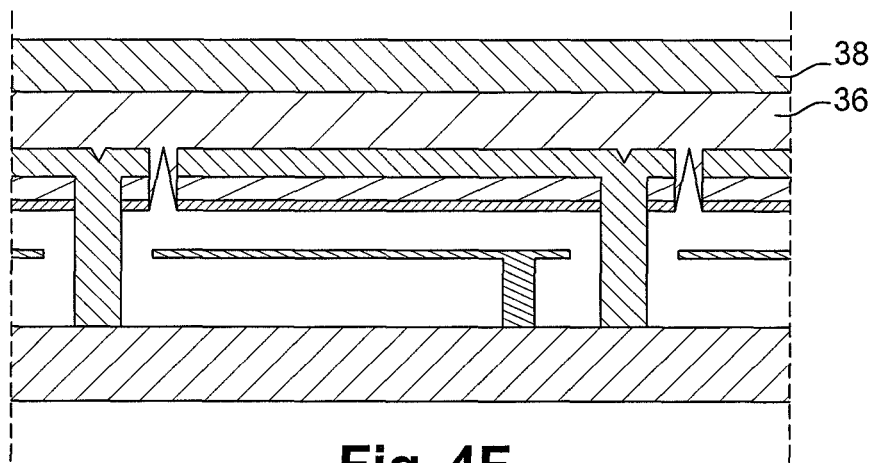

The method for example carries on as in the state of the art by the forming of vias (and/or grooves) 28 in first optical layer 40 and sacrificial layers 22, 24 all the way to substrate 10 (FIG. 4C), the CVD or PECVD of an a-Si layer 30 to line, or even to fill, the vias and form lateral walls 18 of the package (FIG. 4D), the forming of vents 22 through first optical layer 40 (FIG. 4E) and layer 30, the removal of the sacrificial layers, and the deposition of the Ge and ZnS layers (FIG. 4F).

It should more particularly be noted that a-Si layer 30 may be deposited by CVD on ZnS layer 40B. Although the ZnS layer is considered a problem in terms of physico-chemical stability beyond 300° C., the inventors have however observed that, on the contrary, it acceptably withstands the thermal activation, usually in the order of 350° C., required for the subsequent forming of layer 30 by CVD.

Figure 5A:
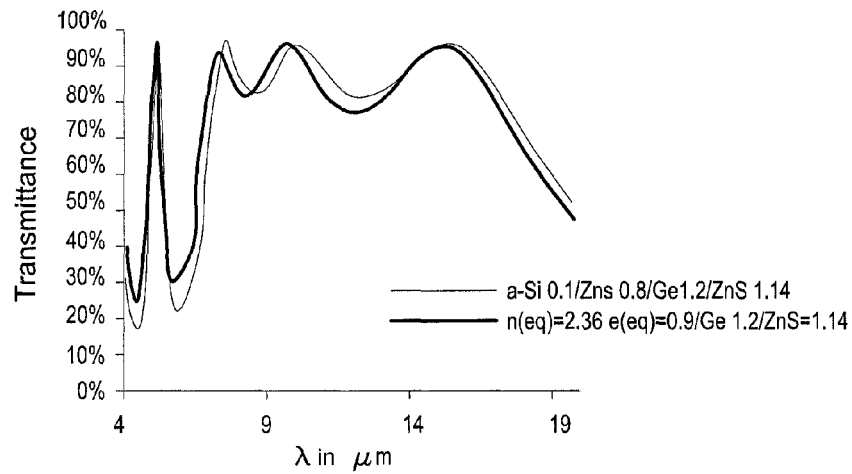
FIGS. 5A to 5C are diagrams illustrating transmittance spectrums of caps according to the first embodiment.

FIG. 5A illustrates an example of a theoretical transmittance spectrum resulting from a stack formed of 0.1 µm of CVD a-Si (layer 40A), of 0.8 µm of ZnS (layer 40B), of 0.6 µm of CVD a-Si (layer 30), of 1.2 µm of Ge (layer 36), and of 1.15 µm of ZnS (layer 38). The thick curve indicates a transmittance calculated by taking into account the refraction index of each material present, and the thin curve indicates a transmittance calculated by taking into account the equivalent refraction index of optical structure 40A, 40B. The three optical structures (first 40, second 30+36, third 38) are here all substantially quarter-wave tuned in the vicinity of $\lambda_{10}$=10 µm with $p_1$=1, $p_2$=2, and $p_3$=1 to provide one of the preferred window-cap forms specified hereafter. An average transmittance of ~93% is here obtained on the [8; 14 µm] band, despite non-negligible, though very acceptable, intra-band oscillations. The estimate of the transmittance resulting from the same linerfree structure 40A, that is, with the ZnS layer assumed to be the only constituent of the first quarter-wave tuned optical structure, is ~94%. The technically reasonable construction with two layers 40A-40B thus only induces a second-order degradation.

Figure 5B:
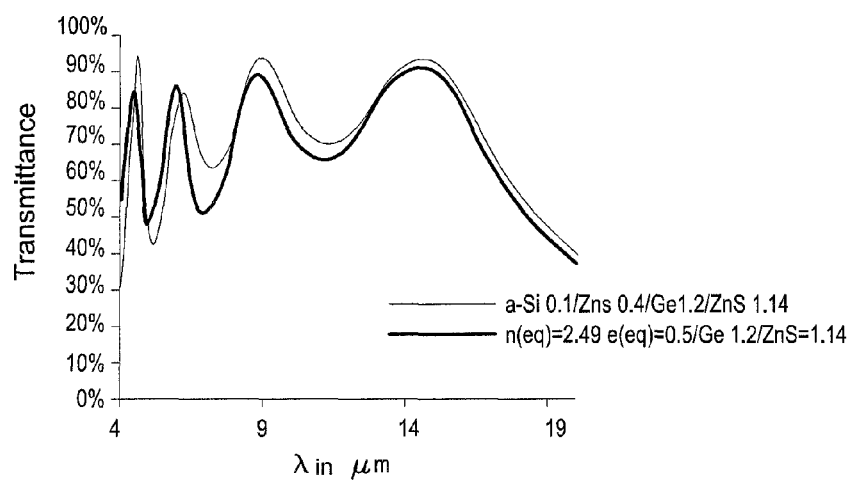
Figure 5C:
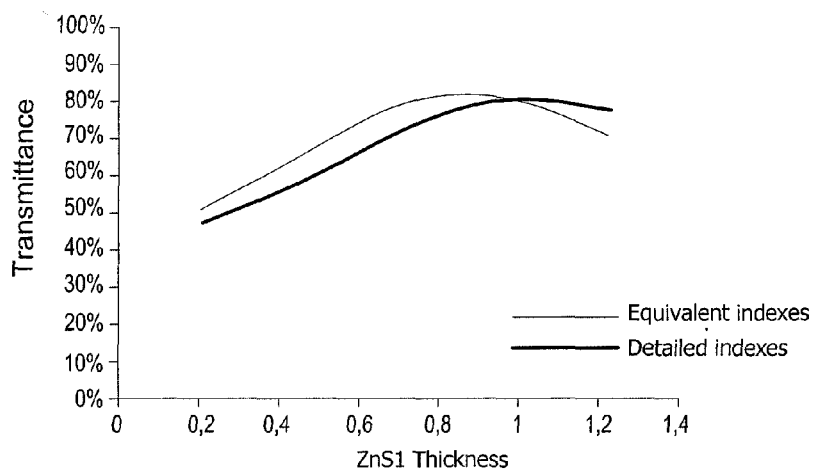

FIG. 5B illustrates the spectrum resulting from the above stack, with the sole difference that the geometric thickness of ZnS of layer 40B is equal to 0.4 µm, that is, far below the range considered optimal in terms of average transmittance (0.8-1 µm). FIG. 5C illustrates the behavior of the average transmittance according to the geometric thickness of ZnS of layer 40B with no layer 40A. The two curves of FIGS. 5A-C respectively indicate the result either of a detailed calculation taking into account the respective indexes and geometric thicknesses of layers 40A and 40B, or by means of a single optical layer of equivalent index $n_{eq}^1$, and having a total optical thickness greater than $\lambda_{10}/10$, in particular equal to $\lambda_{10}/4$. A substantial improvement of the transmittance in the band of interest is thus obtained over the entire portion of the window covered with layer 40B. The average transmittance being already improved by approximately 10 points by the use of a ZnS layer 40B having a very limited geometric thickness (in the order of 0.3 µm), and the optimized preferred structure providing a very substantial gain of more than 20 points, without for all this for a degradation of the intra-band variation of the transmittance to be observed.

The acceptable similarity between the results, be they detailed (taking into account the distributed refraction indexes) or simplified (taking into account the equivalent refraction indexes) further justifies the simplifying use of equivalent indexes in terms of definition of the features of the invention. In the examples relative to FIGS. 5A-C, a geometric thickness of 0.1 µm for CVD a-Si liner 40A of index ~3.6 has been retained, that is, which corresponds to an optical thickness of the first structure intentionally somewhat thicker than the indicative limit (for $\lambda_{10}$=10 µm) $\lambda_{10}/30$ for which index $n_{eq}^1$ can be used. The resulting error on the transmittance spectrum and even more on the transmittance integrated over the band of interest remains very limited, and quite acceptable.

Second Embodiment

According to a second embodiment, the first optical structure is obtained at least partially by means of a layer of an amorphous alloy of carbon and silicon (a-$Si_xC_{(1-x)}$ with 0<x<1) or of amorphous carbon (a-C), the two cases being designated hereafter by terms "a-$Si_xC_{(1-x)}$, 0≤x<1".

In optical terms, materials of a-$Si_xC_{(1-x)}$ type are known to exhibit absorption bands in particular towards 12.8 µm (780 $cm^{-1}$ in spectroscopic notation) and thus in the LWIR band. Such absorption bands beyond 9 µm in practice disappear from materials close to x=0 and x=1, since they are in particular associated with the C—Si bonds, and are accordingly particularly intense in alloys having more or less balanced C/Si proportions (that is, close to a-SiC). Such an adverse feature is theoretically crippling in the LWIR band in the context of the forming of expected windows essentially transparent over the entire band. However, the invention advocates on the one hand the use of materials with a low silicon content, of very acceptable transparency, that is, with a low or no carbon content, and on the other hand according to very small geometric thicknesses in the order of 1 µm. Further, even for a "worst case" formulation in the vicinity of the stoichiometric form of amorphous silicon carbide a-SiC (x~0.5), the absorption factor may be contained all over the LWIR spectrum below 200 $cm^{-1}$. This value provides an attenuation in normal incidence of 1% of the radiation at the maximum absorption wavelength for a 0.5-µm geometric thickness, and substantially less after integration over the entire band of interest. Thus, even in the theoretically least favorable case of a composition (x~0.5), the generated sensitivity loss of the detector remains moderate, and further very widely compensated for by the improvement of the average transmittance induced by the selection of this material.

Particularly, the second embodiment differs from the first embodiment in that a-Si layer 40A or a-Si layer 40A and ZnS layer 40B is (are) replaced with a a-$Si_xC_{(1-x)}$ layer 0≤x<1, for example deposited by means of a PECVD method.

Such materials have been widely referenced in literature, and are relatively easily available by various known techniques, particularly of PECVD type. The following documents will for example be referred to: A. Carbone et Al in J. Mat. Res., Vol 5, No 12, December 1990; or I. Pereyra et Al in Brasilian J. of Phys., Vol. 30, September 2000; or B. Racine et Al in J. Ap. Phys., Vol 90, Nr 10, November 2001; or also A. El Khalfi et Al in Arabian J. for Sci. and Eng., Volume 39, Issue 7, July 2014, pp 5771-5776.

Particularly, the manufacturing of an amorphous silicon layer obtained by methods of non-thermal dissociation of silane ($SiH_4$) typically below 300° C., or even at room temperature, is known. Glow Discharge (GD) activation methods, also called PECVD, or the like, generally but not necessarily carried out in a hydrogen dilution, enable to access specific forms (usually called a-Si:H) having a low index up to 2.5-2.6 in long-wave infrared (LWIR). By alloying the amorphous silicon obtained by such methods with a moderate quantity, for example, from 5 to 20% (At) of carbon by means of appropriate organic gaseous additives (for example, various hydrocarbons such as $CH_4$, $C_2H_2$, $C_2H_4$, etc.), it is known to form an alloy of a-$Si_xC_{(1-x)}$ type.

In a first variation, which particularly advantageous in terms of transparency, the first optical structure 40 is at least partially and preferably essentially made of amorphous carbon (case x=0). An a-C layer is usually formed by means of gaseous carbon precursors (various hydrocarbons such as $CH_4$, $C_2H_2$, $C_2H_4$, etc.) decomposed under a low pressure and a low temperature, or even at ambient temperature, by plasma activation, sometimes labeled "glow discharge", typically to form so-called "DLC" (Diamond Like Carbon) thin layers.

a-C thin-film materials have a refraction index in the range from 2 to 2.2 on the LWIR band according to their structural details, and an optical transparency very acceptable in infrared. Such low index values are very advantageous to limit diopter reflection losses (called Fresnel losses) at the interface between the inner vacuum of the package and the lower wall of the window, and to use at best partial reflections at the interface with the second "high-index" optical layer arranged thereabove (for example, a-Si layer 30+Ge layer 36).

Indeed, from an optical viewpoint, the window according to the invention is formed of:

a first optical structure 40, having an equivalent refraction index $n_{eq}^1$;

topped with a second optical structure formed of layers 30 and 36, having an equivalent refraction index $n_{eq}^{2}$;

topped with a third optical structure formed of layer 38, having an equivalent refraction index $n_{eq}^{3}$.

Now, at least in the case where second optical structure 30, 36 is very thick, that is, without requiring interference considerations, it is known as advantageous for the first and second optical structures to be designed so as to verify relation $n_{eq}^{1}=\sqrt{(n_{eq}^{2})}$, which enables to cancel the reflection when the first structure is quarter-wave tuned ($\lambda_{10}/4$). The same applies to the present case of structures having limited optical thicknesses all taking part in the interference process. This relation is easier to obtain due to the refraction index of a-C. For example, since the reference construction further advantageously involves germanium of index 4-4.2 in the LWIR band as the main constituent of assembly 30+36, an index in the order of 2-2.1 for first optical structure 40 enables to obtain or to approach said relation.

Advantageously, a liner layer 40A made of CVD a-Si, having a geometric thickness for example in the range from 0.05 μm to 0.1 μm, is previously deposited on the sacrificial layer to limit the erosion of the a-C layer under the effect of the oxidizing plasma typically used during the subsequent ashing for removing the organic sacrificial materials. The liner layer also has the advantage of forming a barrier against the hydrogen contained in the amorphous carbon structure and thus of preventing a possible long-term effusion in the package once sealed.

As a variation, liner layer 40A is an a-$Si_xC_{(1-x)}$ layer where x is not negligible in atomic content, typically ≥0.05, and preferably ≤0.5, for example with a geometric thickness in the range from 0.05 μm to 0.1 μm. Not only is such a layer advantageously chemically compatible with the a-C topping it, but further, the refraction index of a-$Si_xC_{(1-x)}$ is much smaller than that of CVD a-Si. Indeed, the index in the LWIR band of the alloyed materials increases with the added silicon content, but remains in the vicinity of ideal values provided by amorphous carbon at low silicon concentrations, without typically exceeding 2.4 up to near 50% of Si (x=0.5). Thereby, the silicon, even by a small proportion, contained in the material of layer 40A, oxidizes on the first surface layers and protects the underlying material from oxidizing erosion typical of organic sacrificial layer removal. Advantageously though optionally, a layer forming a barrier against hydrogen, for example, 20 nm of CVD a-Si, is first deposited on the sacrificial layer, to prevent, as indicated hereabove, possible effusions of hydrogen contained in the structure of the a-$Si_xC_{(1-x)}$ material. Here again, the layer being very thin, it only very slightly disturbs the optical behavior of the structure.

However, a liner layer 40A or the incorporation of silicon into the bulk of layer 40 is not necessary if the material of sacrificial layers 22, 24 is of mineral nature, that is, it requires no oxidizing method to be removed.

In a second variation, first optical structure 40 is entirely made of a single a-$Si_xC_{(1-x)}$ layer, with 0.05≤x≤0.5, this material enabling to play the role of a hard mask and having a refraction index smaller than 2.6. First optical structure 40 is advantageously deposited at once, which also has the advantage of sparing a manufacturing step, that is, that of liner layer 40A. Optionally, a layer forming a barrier against hydrogen, for example, 20 nm of CVD a-Si, may first be deposited on the sacrificial layer, for the above-discussed reasons.

In a third variation, continuing the first or the second variation, layer 30, deposited to form lateral walls 18 of the package, is also partly or totally made of a-$Si_xC_{(1-x)}$, 0≤x<1, for example, a-C or a-$Si_xC_{(1-x)}$ with 0.05≤x≤0.5. A first optical structure is thus obtained, which partially or totally includes layer 30 of the first embodiment.

In the first and second embodiments, a first optical structure is thus obtained, which is made of the stacking of layers 40A, 40B (or 40B alone) of equivalent refraction index $n_{eq}^{1}$ typically smaller than 2.6 and preferably in the range from 2 to 2.2. A total optical thickness typically greater than or equal to $\lambda_{10}/10$ (that is, 1 μm for $\lambda_{10}=10$ μm), and preferably close to $\lambda_{10}/4$, may thus be formed, and preferably used.

Figure 6A:
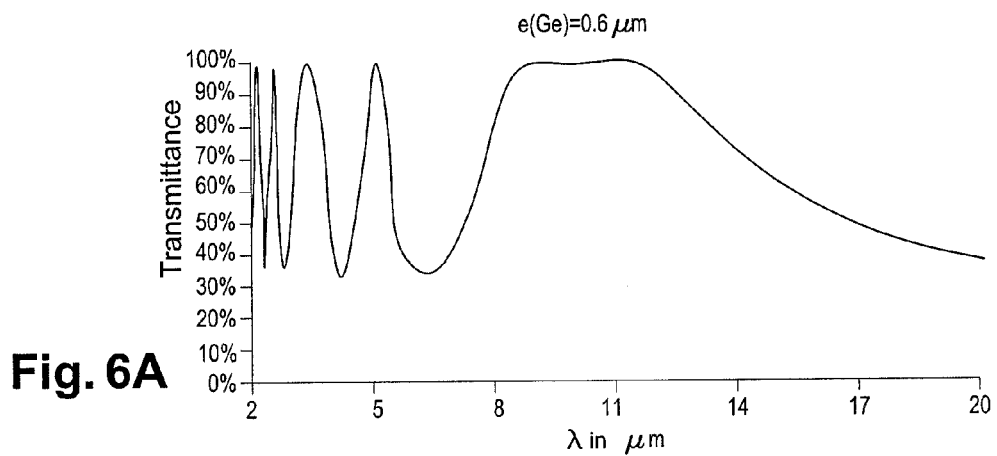
FIGS. 6A to 6E are diagrams illustrating transmittance spectrums of caps according to the second embodiment.
Figure 6B:
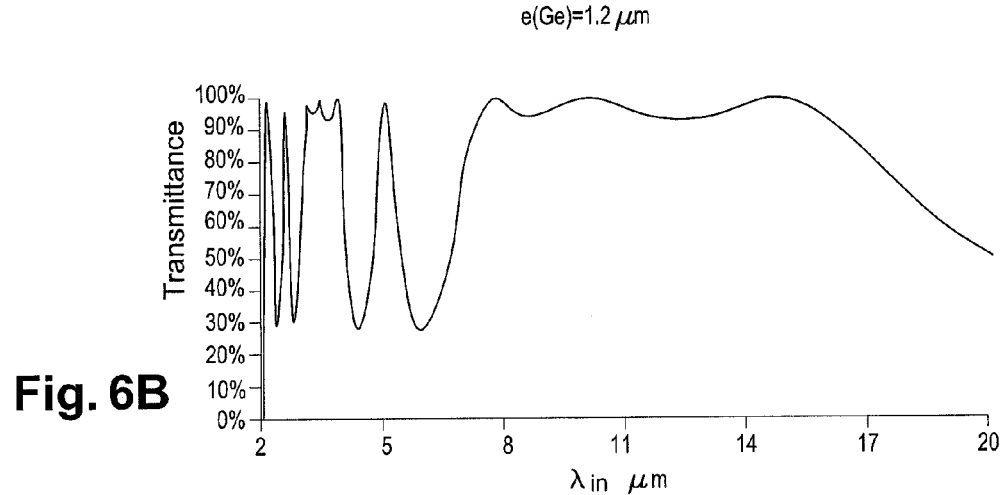
Figure 6C:
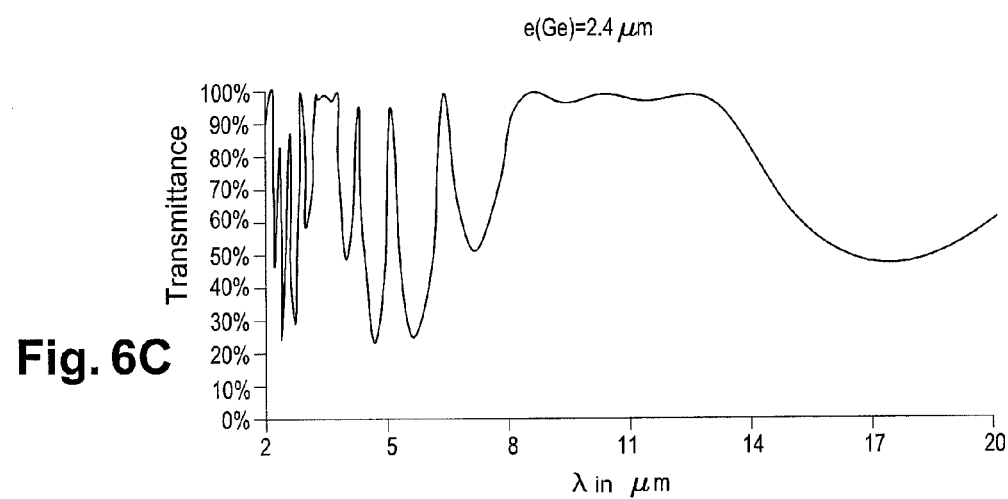

FIGS. 6A, 6B, and 6C shows the transmittance spectrum of a window according to the third variation of the second embodiment, formed of a first organic structure, preferably having equivalent refraction index $n_{eq}^{1}=2.0$ and a substantially quarter-wave optical thickness at the first order ($p_1=1$) at 10 μm, that is ~1.2 μm (for example, a liner layer 40A of 0.05 μm of a-$Si_xC_{(1-x)}$ with x=0.05 and an a-C layer for layers 40B and 30), of a second uniform "high index" optical structure (Ge), and then of a third adapted "low index" optical structure (for example, ZnS). FIG. 6A corresponds to the specific case where $p_2=1$, that is, $e_2$~0.6 μm, FIG. 6B corresponds to the preferred specific case where $p_2=2$, that is, $e_2$~1.2 μm, and FIG. 6C corresponds to another preferred specific case where $p_2=4$, that is, $e_2$~2.4 μm. In these preferred cases, spectrums very close to the targeted object are obtained, that is, beyond 93% from 7.3 to 16 μm for $p_2=2$ (excellent widely "projecting" window) and beyond 97% from 8.2 to 13 μm for $p_2=4$ (almost perfect slightly "inscribed" window).

Figure 3A:
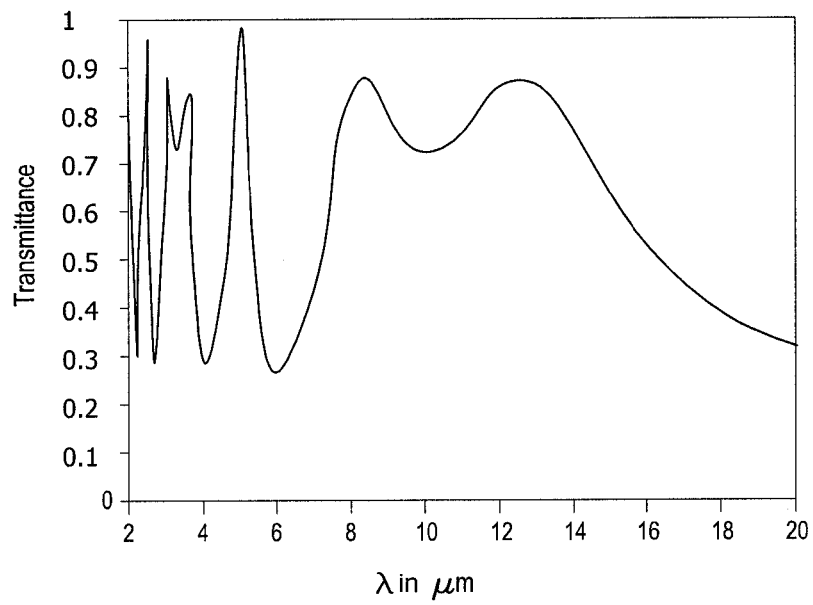
FIGS. 3A and 3B illustrate two transmittances of the window of the detector of FIG. 1 for different thicknesses of the layers forming the window.
Figure 3B:
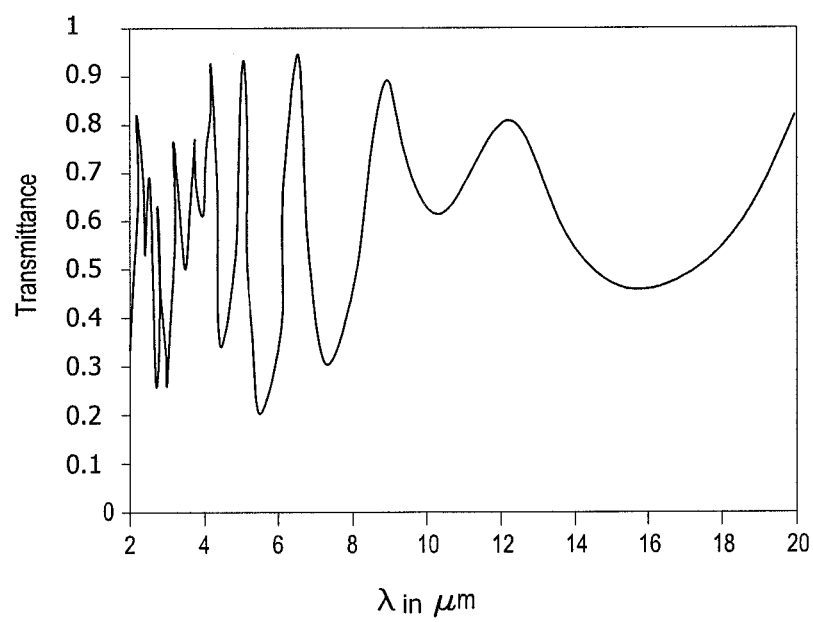

Actually, all the spectrums obtained with a stack of this type are highly advantageous over spectrums of the state of the art (for example illustrated in FIGS. 3A and 3B) and this, whatever the optical thickness of the second high-index optical layer. Indeed, case $p_2=1$ is already by far preferable to the spectrum of FIG. 3A regarding the preferred quality features. Values $e_2$ smaller, intermediate, or greater than preferred points $p_2=1$, 2, and 4 simply result in more or less deeply attenuating one or both margins of the LWIR band (and the average value on the band) with no specific criticality. The final preference is then defined by the variable technological implementation convenience in the vicinity of the various indicated preferred points.

It should in particular be noted that in the context of the third variation of the second embodiment, layer 30 being totally made of a-$Si_xC_{(1-x)}$, 0≤x<1, the adjustment of the optical thicknesses of the different optical structures is greatly simplified and results in a very good transmittance, as illustrated hereabove in relation with FIGS. 6A-6D. In the context of the first and second variations and of the first embodiment, the second optical structure is made of a-Si layer 30 and of Ge layer 36. Such an additional complexity is however not critical for the setting of the different optical thicknesses. Indeed, starting from the design rules of the state of the art, that is, a layer 30 in the order of 0.6 μm of CVD a-Si at least to form walls 18 and of at least 0.6 μm of Ge to close vents 22, the total geometric thickness of the second high-index optical layer (a-Si and Ge) accordingly settles at least around 1.2 μm. Optical thickness $e_2$ of the second optical structure is advantageously selected to obtain a quarter-wave tuning of even order, that is, $e_2$~$2k\cdot\lambda_{10}/4$. A transmittance of the window very close to that illustrated in FIGS. 6B and 6C is thus obtained. Various implementation details will be explained in this sense hereafter. It is also preferred to avoid "very thick" constructions (k>2), which imply that the ratio of the total thickness of the second and third optical structures to the transversal area of lateral walls 18 supporting them is high, which might raise a mechanical resistance issue.

It should thus be noted that for the first and second embodiments, the window according to the invention has at most a total geometric thickness $\lambda_{10}/4n\, n_{eq}^1$, $\lambda_{10}/n_{eq}^2+\lambda_{10}/4n_{eq}^3 \leq \lambda_{10}/2$. The first term and the third term correspond to the first and third optical structures provided with an index close to 2 (or greater, up to 2.6), and the second term represents the second optical structure provided with an index greater than 3.4 and typically in the range from 3.6 to 4.2 and at the preferred higher tuning order ($p_2=4$). Considering the small geometric thickness of the window according to the invention, a very good mechanical resistance is obtained, and it is possible to provide manufacturing variations with thinner lateral walls or generically a smaller total occupied area on the surface of a pixel, some of these being for example used as a mechanical support pillar, rather than as walls defining a hermetic cavity.

It should be noted that the insertion of a first optical structure having an equivalent refraction index smaller than or equal to 2.6 at the base of a stack of the state of the art very efficiently improves the average transmittance of the window over the band of interest, and this all the better, of course, as index $n_{eq}^1$ comes closer to ideal value $(n_{eq}^2)^{0.5}$.

Figure 6D:
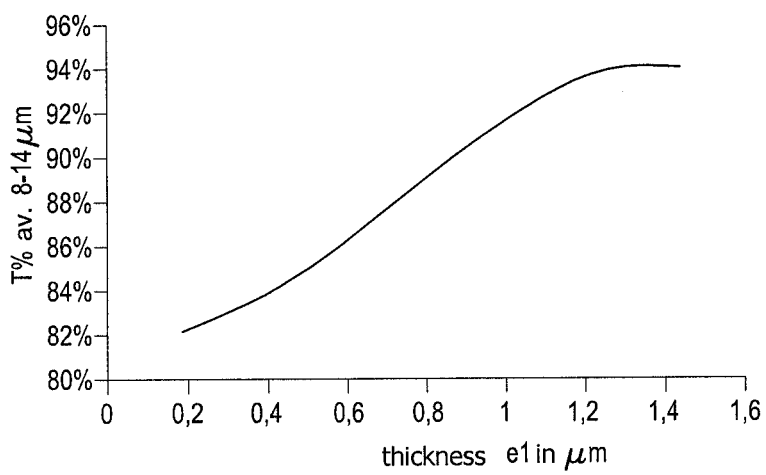
Figure 6E:
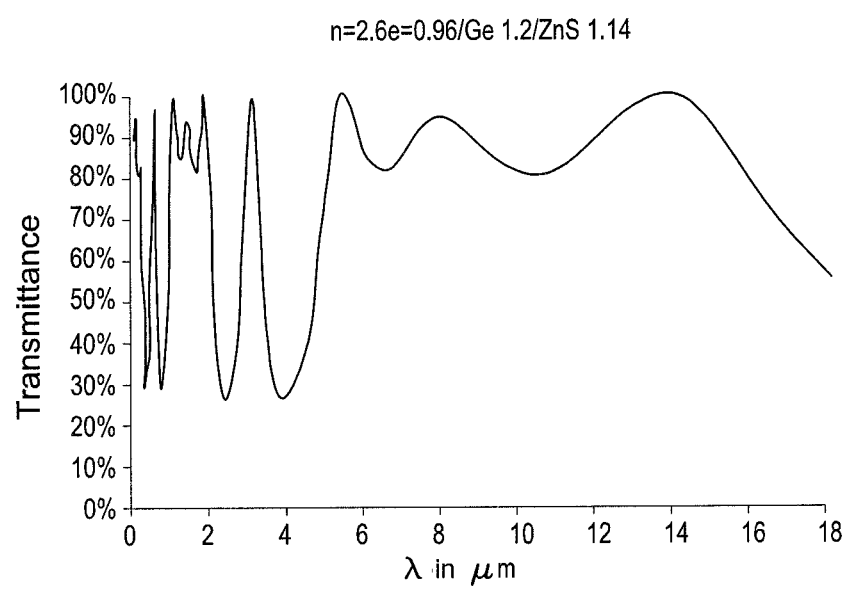

FIG. 6D for example illustrates the average transmittance of the window according to geometric thickness $e_1$ of the first optical structure having an "ideal" refraction index $n_{eq}^1$ in the order of 2. A very substantial improvement by in the order of 10 points appears in this case from as soon as 0.2 am of geometric thickness (that is, an optical thickness of ~0.4 It should be noted that even a first optical structure having a 2.6 equivalent refraction index enables to define the transmittance illustrated in FIG. 6E. A substantial improvement of the average transmittance over the window of the state of the art is here again obtained, due to the substantial increase of index contrast $$\frac{n_{eq}^2 - n_{eq}^1}{0.5 \times (n_{eq}^2 + n_{eq}^1)},$$

and this although index $n_{eq}^1$ is much greater than the ideal values (close to 2).

Figure 2I:
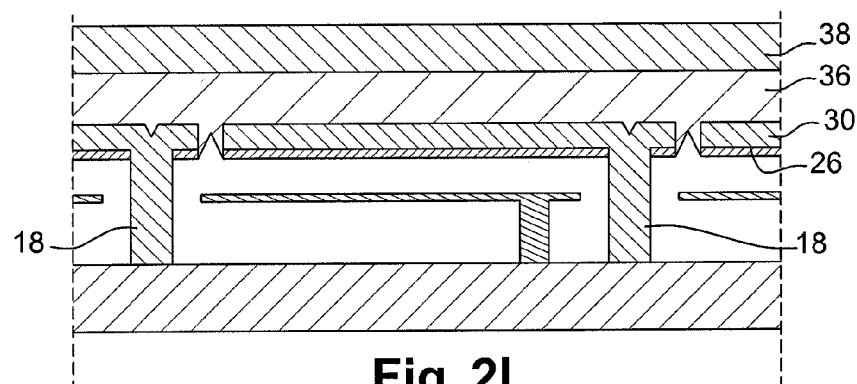
Figure 7A:
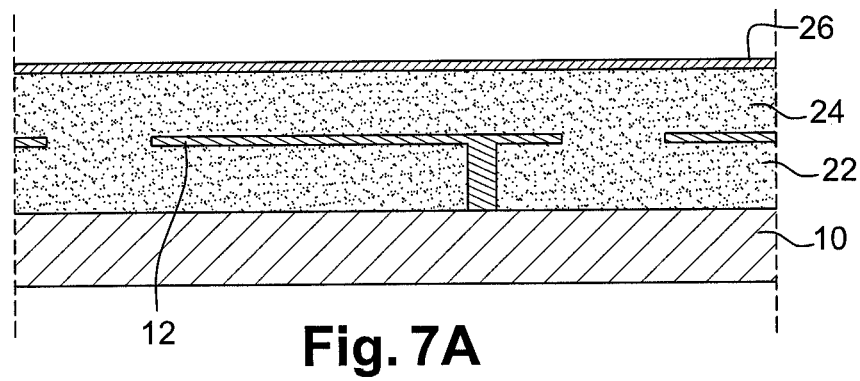
FIGS. 7A to 7E are simplified cross-section views illustrating the manufacturing of a cap/window having a textured first optical structure.

B. Monolithic Manufacturing by Successive Depositions and Surface Texturing of the First Optical Layer Third Embodiment A first variation of the third embodiment comprises modifying the window of the state of the art comprising the first optical structure formed of CVD a-Si layer 26 deposited on sacrificial layer 24 in order, in particular, to play the role of a hard mask, and of CVD a-Si layer 30, deposited to form lateral walls 18 of the package (FIG. 2I for example). In this variation, illustrated in the simplified cross-section views of 7A-7E, the method of monolithic manufacturing of the window starts for example similarly to the method of the state of the art with the deposition of CVD a-Si layer 26 on second sacrificial layer 24 (FIG. 7A).

Figure 7B:
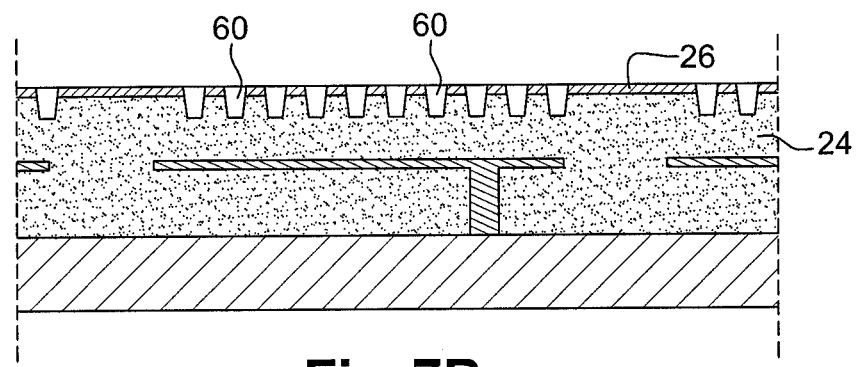
Figure 7C:
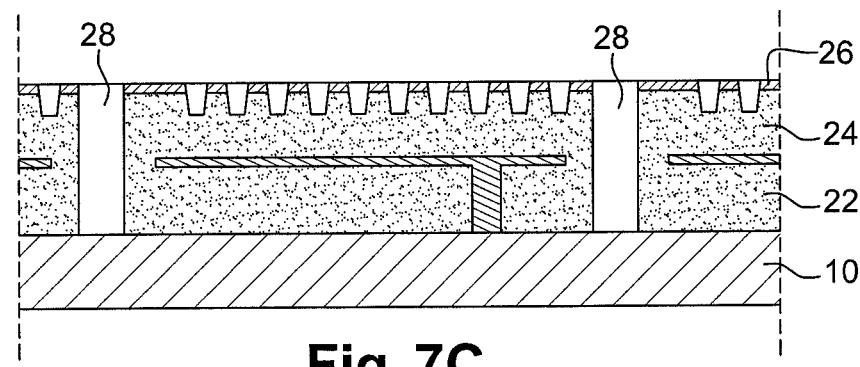

At this stage, layer 26 and sacrificial layer 24 are textured by etching to form cavities 60 in sacrificial layer 24 according to a regular two-dimensional grating having an order of at least 2, distributed over most of the area occupied by each elementary membrane 12 (FIG. 7B). The etching is performed in known fashion by means of so-called anisotropic methods, enabling to form vertical or slightly inclined sides (typically between 70° and) 90° within the abilities of those skilled in the art. The repetition pitch, the filling factor (for example, the proportion of etched surfaces at this step), and the depth (measured normally to the layer plane) of grating 60 of cavities define those of a grating of patterns such as described hereafter.

Figure 7D:
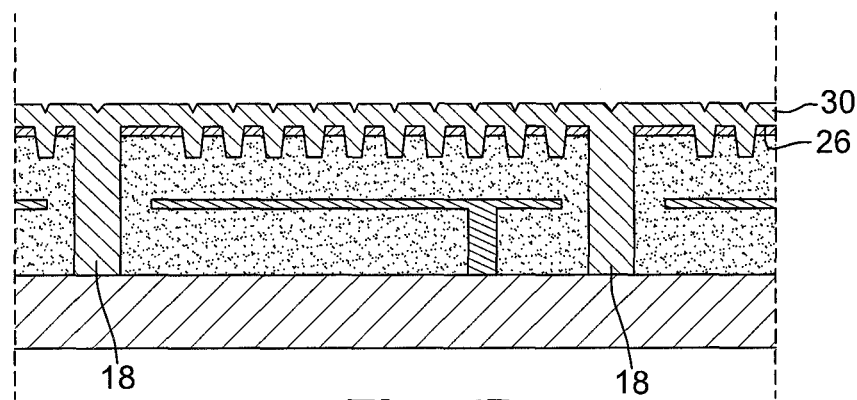

The method carries on, as in the state of the art, by the anisotropic etching of layer 26 and of sacrificial layers 22, 24 down to substrate 10, to form vias or trenches 28 having lateral walls 18 formed therein (FIG. 7B), and by the deposition of the second layer 30 of CVD a-Si to at least cover, or even totally fill, vias 28, thus forming lateral walls 18. Such a second deposition also results in at least partially filling with a-Si cavities 60 (FIG. 7D). The method carries on as in the state of the art (forming of vents, removal of the sacrificial layers, deposition of a high-index layer hermetically closing the vents, and deposition of a layer of lower index) to result in the window illustrated in FIG. 7E. Referring to the detail view of FIG. 8, a first optical structure 64 made of CVD a-Si having a lower surface comprised in cavity 34 textured by a periodic grating of raised two-dimensional patterns 62, for example, patterns which may be cylindrical (of circular, square, etc. shape), conical (revolution, pyramidal, etc.) or grid-like, is thus obtained.

The properties of pattern grating 62 (pitch, filling factor, or pattern height $e_T$ from layer 26) are selected so that layer $e_T$ forms the first optical structure according to the invention for the band of interest, and thus behaves as a layer of homogeneous material having an equivalent refraction index (here, effective) smaller than or equal to 2.6. More particularly, pattern grating 62 causes no diffraction-type interference phenomenon in the band of interest. Particularly, pitch p of the grating is much smaller than the considered wavelength, typically, practically smaller than $\lambda_{10}/3$, and height $e_T$ of the patterns is typically in the range from $\lambda_{10}/10n_{eq}^1$ to $\lambda_{10}/4$, where $n_{eq}^1$ is the equivalent refraction index (here, effective) desired for the optical structure of geometric thickness $e_T$. For example, the pitch of the grating is smaller than 3.5 micrometers for the LWIR band, or generically smaller than $\lambda_{10}/3$, and more typically in the range from 1.5 to 2 micrometers, to remain on the one hand within practical design rules in terms of lithography and on the other hand which result in a substantial filling of the cavities with layer 30.

For example, for patterns 62 with vertical walls and a refraction index in the cavity equal to 1, the effective refraction index $n_{\mathit{eff}}$ of thickness $e_T$ is equal at the first order to $((\mathrm{ff}\cdot n^2+(1-\mathrm{ff}))^{1/2}$, where n is the refraction index of the material of patterns 62, that is, that of CVD a-Si, and ff is the filling factor (0<ff<1) of the grating of patterns 62, defined by the proportion (1–ff) of surface area masked by the patterns (for example, the area occupied by layer 26) relative to its total area.

According to a second variation, cavities 60 are formed before the deposition of CVD a-Si layer 26. Sacrificial layer 24 is textured to form said cavities, either directly, without using a hard mask, or by using a hard mask which is then easily removed after having been used, for example, made of aluminum. The etching depth may advantageously be decreased far below 1 μm, in which case a direct lithography is easily feasible, and actually more convenient, in particular if inclined (non-vertical) sides are desired to be obtained. Such a variation for example advantageously enables to protect the entire surface of sacrificial layer 24 (except for that corresponding to vias 28) with a-Si layer 26 while vias 28 are being formed. Layer 26 then forms part of the material filling of cavities 60 formed in sacrificial layer 24. It can thus take part according to its own index in the effective index of thickness $e_T$ in the case where the materials of layer 26 and of layer 30 are different.

These two first variations have a variety of advantages over the previously-described first and second embodiments. In particular, to form the patterns, it is not necessary to modify the monolithic manufacturing of the state of the art. The result is thus advantageous not only in optical terms but also economically, despite the use of an additional relatively noncritical lithography step.

An optical layer $e_T$ having its index $n_{eq}^1$ adjustable by means of factor ff defined by lithographic etching directly in the vicinity of the more efficient values for the optimization of the complete stack is thus obtained. When the filling of the grating structure is formed of a variety of amorphous silicon of high index (close to crystalline silicon c-Si) typically in the range from 3.4 to 3.7, a factor ff close to 0.3 provides an effective index close to 2.1. This very substantially improves the average transmittance of the window in the LWIR band, the transmittance being indeed close to that of FIG. 6C.

To limit the risk, as compared with the reference technique of mechanical contact induced by bringing together the ends of patterns 62 and of membrane 12, it is advantageous to provide a thicker sacrificial layer 24, for example, thicker by thickness $e_T$ of patterns 62.

Figure 7E:
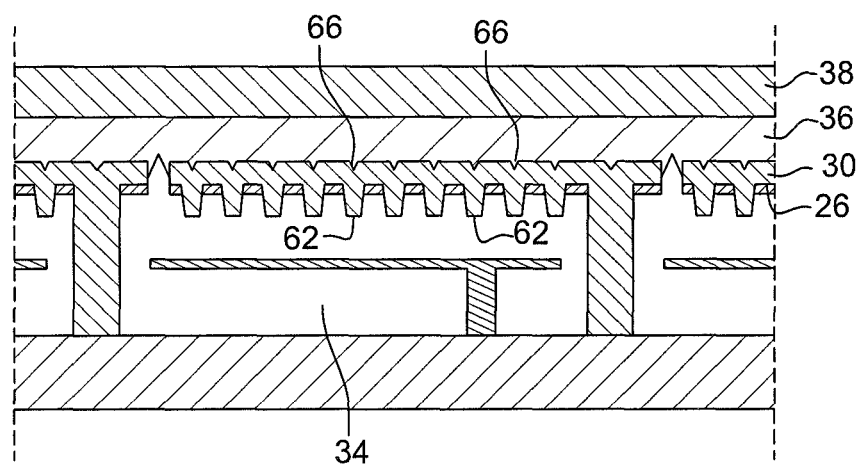

In a third variation, particularly advantageous in the case of a direct etching of the grating with no hard mask or after removal of a temporary aluminum hard mask, for example, patterns 62 of the grating are formed of two or more different materials. In a first variation illustrated in the detail view of FIG. 8B, the third variation differs from the second variation by the deposition of a first CVD a-Si layer 26 on textured sacrificial layer 24, which does not totally fill cavities 60, followed by the deposition of a second layer 70 of a-Si$_x$C$_{(1-x)}$ 0<x<1, and preferably x≥0.05. Bilayer patterns 62 are thus formed. Since the refraction index of a-Si$_x$C$_{(1-x)}$ is smaller than that of CVD a-Si, for a grating geometrically identical to that of the first variation, the effective refraction index of the grating is thus smaller. It is thus possible to deposit a relatively thick layer of a-Si$_x$C$_{(1-x)}$, for example, from 0.2 µm to 0.3 µm, to reinforce the structure of the hard etch mask of vias 28. As illustrated in FIG. 7E by slight depressions 66 of the upper surface of layer 30, the total geometric thickness of materials 26 and 70 deposited on the sacrificial layer may result in a non-planar surface. However, the planarizing of the texture, that is, the attenuation of the amplitude of depressions 66, is completed by means of CVD a-Si layer 30 essentially intended in this case for the filling of vias 28 to form the lateral walls. The high-index material balance before the deposition of layer 36 (typically made of Ge) is thus decreased as compared with the reference technique, and as a compensation, layer 36 may then be thickened in order to secure the sealing of the vents.

In a fourth variation, the CVD a-Si of the second variation is replaced with a layer of a-Si$_x$C$_{(1-x)}$ 0<x<1, and preferably x≥0.05. The geometric thickness of this layer is selected to obtain the total filling of cavities 60 of the sacrificial layer in order to obtain a substantial polarization effect, which is in particular allowed by the refraction index of a-Si$_x$C$_{(1-x)}$, which is smaller than that of CVD a-Si. Particularly, to obtain this effect, the geometric thickness of the deposited a-Si$_x$C$_{(1-x)}$ layer is greater than the average half-space between cavities 60 etched in sacrificial layer 24. As a variation, the a-Si$_x$C$_{(1-x)}$ layer is formed after the forming of vias 28, which can be achieved at least in the case where the form factor of said patterns is compatible with the specific features of structural conformability of the PECVD method implemented at this step.

In a fifth variation, the partial or total filling of cavities 60 of the sacrificial layer is obtained by means of one or a plurality of layers of an alloy of a-Si$_x$Ge$_{(1-x)}$ type, 0<x<1. In this case, the specific index of this layer (or each of these layers) is intermediate between at least 3.4 and 4.2 and more typically between 3.6 and 4.2 in the LWIR band. The forming of the targeted effective index of the first optical structure, for example, close to 2, is obtained by means of material filling factor ff of the grating which will typically be smaller (for a same result $n_{eq}^1$) than in the context of the first variation, for example. A factor ff of 0.35 will for example be preferred with an alloyed filling material having an average index close to 3.9, thus resulting in an effective index close to 2.4.

An advantage of this variation is the user-friendliness of such alloys by a CVD technique which naturally has all the expected favorable technological features, including, in particular, the ability to very efficiently cover or fill vias 28, if present, and the high transparency in LWIR. Advantageously, CVD a-Si layers 26 and 30 are thus replaced with a single a-Si$_x$Ge$_{(1-x)}$ layer. It may thus be directly formed of the first and second optical structures, having their indexes $n_{eq}^1$ and $n_{eq}^2$ ideally adapted in terms of effective refraction index with no technological tradeoff to satisfy relation $n_{eq}^1 \approx n_{eq}^2$, that is, the ability to construct optical assemblies having real (measured) transmittance spectrums very close to the theoretical spectrums of FIGS. 6B and 6C. Indeed, the incorporation of for example 30% (At) of germanium in the alloy of a same material for forming layers 26 and 30 for filling the grating, takes the average index $n_{eq}^1$ of the second optical structure typically beyond 4 at any point of its thickness. The adjustment of index $n_{eq}^1$ of the first structure close to from 2 to 2.1 is further ensured by an adapted value of filling factor ff. Interference couplings are then ideally expressed between the two first optical structures to optimize the integrated transmittance.

Another advantage is the possibility of forming this pair of optical structures $e_1$ and $e_2$ simultaneously optimized according to the specific preferred budgets of high-index material corresponding to $p_2$=2 or 4, without using a continuous thickness greater than that, combined, of layers 26, 30, and 36 of the state of the art, nor materials of a very different nature. Term "continuous" thickness here designates the distance between the two most distant parallel planes which can be drawn within the assembly forming the window, between which only material appears. Indeed, a substantially larger total continuous thickness necessarily results from an optimized preferred construction according to the first and second embodiments. Now, the differential intrinsic and/or thermal stress between layers of substantially different natures (evaporated ZnS or PECVD alloys) may for example induce additional technological complications, particularly mechanical. It is thus preferable to use as small a continuous thickness as possible.

FIGS. 7 and 8 show grating patterns etched with a regular slope, intended to ease the filling of the texture and thus guarantee a cavity-free final structure. The forming of such a preferred configuration in the general case is within the abilities of those skilled in the art, particularly if a direct etching (with no hard mask) of sacrificial layer 24 is performed, but is by no means necessary, particularly if it is implemented by methods of CVD of alloys of a-Si$_x$Ge$_{(1-x)}$ type. It should be understood that the profile of the texture eases the forming of a favorable progressive index gradient between the top of patterns 62 all the way to the vicinity of the inner layers (evaporated Ge) of the window.

An additional advantage of the different variations of this third embodiment is due to the continuity of the optical indexes which can be easily controlled between that of amorphous carbon and silicon, or between amorphous silicon and germanium, by implementing available techniques of alloying with a composition defined according to the preferred specific index. It is thus easy to deposit one or a plurality of physical layers having distributed (staged) indexes or even with a continuous gradient according to the position in altitude in the geometric thickness of a same layer formed in a single PECVD- or CVD-type technological step typically between 1.9 and 4.2 to form the transmissive structures according to the invention.

The persistence of waves 66 of small amplitude shown in FIG. 7E at the surface of layer 30 can be observed. The raised portions result from the essentially isotropic progressive coverage of the cavities formed in sacrificial layer 24. The attenuation of the amplitude of these waves with the increasing geometric thickness of layer 30 in the case of amorphous silicon or the like materials obtained by CVD, and by a slightly lesser extent PECVD, is typically ideal. Of course, this amplitude is all the smaller as the pitch of the structures is small, for an identical deposited geometric thickness. Such residual interface waves between layers thus attenuate by themselves from one interface to the next one, and if still present at a given level, can be but favorable to the attenuation of partial internal reflections for each index step of the structure. Further, their pitch remains equal to pitch p of the initial step of "molding" the filling material, whatever the general thickening of the stack, and by any method whatsoever.

It will be within the abilities of those skilled in the art to determine the most advantageous technological tradeoffs according to their specific preferences and constraints, but the additional facilities provided by the invention will always result in a substantial performance gain of the completed device in terms of optical transmittance, and thus of sensitivity of the detector.

Of course, the first and second embodiments may be combined with a texturing such as previously described. Particularly, according to alternative embodiments described in relation with these embodiments, a layer of an amorphous alloy of a-$Si_xC_{(1-x)}$ type is selected with a rate x which induces an equivalent refraction index of the first optical structure (with no texturing) close or equal to 2.6. The presence of the texturing thus enables to further decrease the equivalent refraction index of the first resulting optical structure, and particularly to adjust the index to a value close to 2.

C. Monolithic Manufacturing of the Third Optical Structure

Fourth Embodiment

In the state of the art, the third and last optical structure 38 is made of ZnS. This layer aims at limiting diopter and interference losses with the outer medium (air) in the band of interest. Now, as previously described, such a layer implies technological limitations. The fourth embodiment modifies the third optical structure, as a complement of each of the previous embodiments.

According to a first variation, the third optical structure 38 of the window is formed by means of an amorphous alloy of a-$Si_xC_{(1-x)}$ type $0 \leq x \leq 1$ instead of ZnS. Advantageously, particularly if such a a-$Si_xC_{(1-x)}$ material is already implemented for the partial forming of the first layer, that is, if the necessary equipment and methods are available, it is appropriate to use an amorphous alloy (or a staged or continuous series of alloys) of same a-$Si_xC_{(1-x)}$ type, although not necessarily identical, to form the third structure. Indeed, if a modulation of the vertical index profile is considered useful to optimize in detail the window transmittance, the desired index profile is easily distributed by controlling the parameters of the deposition method between indicative limits 1.9 and 2.6 in the LWIR band.

Typically, the highest refraction index values are preferably formed at the base of the third optical structure, in contact with Ge layer 36, with a relatively high silicon content, or even 100% (x=0), and a lower index will be targeted to complete optical layer 38, in the extreme formed at the outer surface only of amorphous silicon (x=1). Naturally, though not necessarily, the optical thickness of the third optical structure 38 is preferably adjusted to the optimal favorable interference-forming point on the general transmittance spectrum of the structure, for example and typically around $\lambda_{10}/4$ ($p_3=1$), and preferably still according to an index close to $\sqrt{n_{eq}^1}$, that is, ideally close to 2.1 if the second optical structure is essentially made of germanium.

This option advantageously enables to form the surface portion of the capsule with a material known to be particularly hard and typically abrasion-resistant. This feature is advantageous, in terms of decreased vulnerability to the various cleaning methods to the various intentional or incidental contacts and frictions likely to occur at the end of the manufacturing or integration in the final system, or even during the detector operation.

According to a second variation, the outer surface of the window is textured according to a two-dimensional grating to form the third optical structure. Such a configuration is shown in the detail view of FIG. 9A. Various possibilities and advantages are now provided to form this third structure.

First, the simplest option is not to provide an outer ZnS layer and to directly texture the germanium surface of layer 36 of the state of the art, according to a filling factor ff and a depth $e_3$ to form upper antireflection layer 38. Preferably, an index $n_{eq}^3$ close to 2-2.1 associated with a depth (geometric thickness $e_3$) close to 1.2 μm will be targeted. Of course, the initial geometric thickness of layer 36 such as deposited, or subsequently thickened by means of a complementary CVD method providing a material of high index, should be taken to the adequate value useful to obtain the best result. An additional advantage of a deposition by CVD at this step is the advantageous structural complement for closing vents 32 with evaporated layer 36.

A specific advantage of the forming of the third optical layer by means of a structuring of the high-index material(s) forming the second optical structure deserves being mentioned. It is the possibility, with no technological high-index material budget constraint, to eventually construct a preferred stack having its second optical structure quarter-wave tuned at the first order ($p_2=1$). A relatively narrow transmittance spectrum inscribed within the LWIR band and capable of being positioned around a central value $\lambda_{10}$ according to needs, by means of general tuning $\lambda_{10}/4$ $n_t$ for the geometric thicknesses (or equivalently $\lambda_{10}/4$ for the optical thicknesses), comparable to that of FIG. 3A, or highly transmissive over a wider band adjustable between spectrums 3A and 3B, can easily be achieved, if it is considered preferable. In order to obtain it, an evaporated layer 36, possibly subsequently thickened with a high-index CVD material at a geometric thickness adapted to a subsequent etching of an antireflection grating of index $n_{eq}{}^3$ such as preferred, and simultaneously itself tuned at the first order ($p_3=1$), and which leaves after etching an intact (continuous) high-index optical layer in the vicinity of $\lambda_{10}/4$, will first be formed. In other words, a margin of 1.2 μm (for $\lambda_{10}=10$ μm) is gained over the high-index material budget (for $n_{eq}{}^2\sim4.2$). For example, a total high-index geometric thickness of 1.8 μm, having an upper antireflection ($e_3=1.2$ μm) laid on a residual layer $e_2$ etched therein after a ~0.6 μm etching, is deposited.

A third variation combines the first and second variations, a textured grating being formed by etching through a stack of one or a plurality of layers of a-$Si_xC_{(1-x)}$-type or of a-$Si_xGe_{(1-x)}$-type alloy. An example is shown in the cross-section detail view of FIG. 9B. This variation provides three degrees of liberty in terms of filling factor ff, of etch profile, or of slope of the grating patterns, and of distribution of the indexes in the involved stacked materials layers, to form in all the useful detail the index profile, the implementation and the definition of which will be within the abilities of those skilled in the art with no specific difficulty. In the present context, such a definition will of course aim at optimizing the spectral transmittance in the band of interest, without it being needed to provide further detail.

Advantageously, textured stack 38 of the previous embodiments is covered with a layer 72 deposited according to a conformal (and thus covering) deposition of low index, for example, an a-$Si_xC_{(1-x)}$ layer with, preferably, a silicon content x greater than or equal to 5%. The advantage of such a final coating or "passivation" layer, for example, having a geometric thickness between 0.1 μm and 0.5 μm, is on the one hand to protect the previous layers, even on their sides, against an aggression by oxygen plasmas as already discussed, since the implementation of such methods is generally useful for cleaning or lithography mask removal purposes, in addition to their usefulness for the removal of sacrificial layers. On the other hand, such a specific option provides, as mentioned, a surface totally made of a very hard and abrasion-resistant material, with the already mentioned attached advantages.

Although it is not excluded to form any number of layers between the first optical structure in the sense of the invention and a last optical structure of any numeral to further optimize the average transmittance, the fact of having an average transmittance over the band of interest beyond 95% and essentially deprived of spectral selectivity (with no substantially less transmissive band(s)) as soon as the three optical structures are arranged, results in characterizing the preferred modes of the invention by this general limit. Given the properties of the involved usable materials, this limit actually implies a total geometric thickness smaller than $\lambda_{10}/2$. Losses due to the generally non-zero absorption of the various involved layers, which can only exacerbate optimization difficulties in the case of thicker stacks, in addition to various structural thermomechanical difficulties are here not considered. Such a specific, though only indicative, maximum, forms the upper limit of a stack of three optical structures in the sense of the invention, formed with the provided materials and techniques, each tuned to the maximum preferred order aims at by the invention ($p_1=1$, $p_2=4$, $p_3=1$).

According to all the embodiments of the invention and to all their variations, the inner surfaces of the upper cap and of the lateral walls are inert to the predetermined etch method. According to said method, oxidizing under an oxygen plasma for the etching of the organic sacrificial layers, or a related method (for example based on ozone $O_3$) usually implemented for the dry removal of lithography resins, or acid HFv for the etching of mineral SiO-type layers or the like, the construction may sometimes be simplified as suggested in the development.

D. Optimization of the Absorbance of Sensitive Membranes by Means of Capsules

Fifth Embodiment

The above-described embodiments of the invention essentially aim at optimizing the window transmittance, in particular in terms of average value in the band of interest and of minimum variations, independently from the sensitive membranes and from the substrate. However, by construction, the distance between the lower surface of the window and the bolometric membrane is preferably greater than 1 μm, to avoid a contact between the window and the membrane after the removal of the sacrificial layers and avoid electrostatic and "stiction" effects, and smaller than 3 μm due to the manufacturing constraints for the support elements of the substrate (vias/intermediate grooves). On the other hand, the thickness of the sensitive membrane is intentionally selected to be very small in order to limit the total suspended mass, and a metal reflector is formed on the upper surface of the substrate. An antinode of constructive stationary interferences thus appears at the membrane level between the incident wave and the wave transmitted and then reflected on the metal reflector when the membrane is placed at a distance equal to $\lambda_{10}/(4\cdot n)$, that is, 2.5 μm of vacuum (n=1) above the reflector for a central operating wavelength of 10 μm. In the provided context, the absorber arranged in the membrane is conventionally formed of a metal layer having a sheet resistance Rs in the order of 380 Ohm/square in the presence of a reflector on the substrate. Such an architecture allows a high absorbance of the radiation by the membrane, with a wide maximum in the band of interest. In the context of the fifth embodiment of the invention, a membrane formed of a titanium nitride layer (TiN) having a 8-nm geometric thickness, a 380-Ohm/square sheet resistance, and optical indexes n=10.5 and k=16 (k being the extinction coefficient), at a 10-μm wavelength, having an amorphous Si layer with a 200-nm geometric thickness and indexes n=3.42 and k=0 at 10 μm. Other thicknesses and layouts of materials are of course possible, but at least within 30% of variation of these parameters, there is no incidence at the first order on the resulting preferred geometric configurations.

Now, the inventors have observed that the capsule and the membrane/reflector assembly are both optical resonators of low quality factor which optically interact due to the short distance separating them, relative to the operating wavelength, which impacts the membrane absorbance. More particularly, the position in altitude of the constructive interference fringes is not only determined by the distance separating the membrane from the reflector, as when the membrane faces a free half-space, but also by the distance separating the membrane from the window, and by the refraction index of the first optical structure. The fifth embodiment according to the invention thus comprises optimizing the placing of the semi-absorbing membrane with respect to the constructive interferences in the cavity, by concurrently selecting the thickness and the refraction index of the first optical structure of the window, the distance between the membrane and the reflector, and the distance between the membrane and the lower surface of the window. Thereby, the inventors have observed that the absorbance of the membrane may be substantially increased when the window is constructed according to any of the embodiments provided according to the invention. However, it can also be observed that the optimal setting of the first optical structure of the window deserves being adjusted in the context of a maximization of the absorbance of the membrane such as defined.

Figure 10:
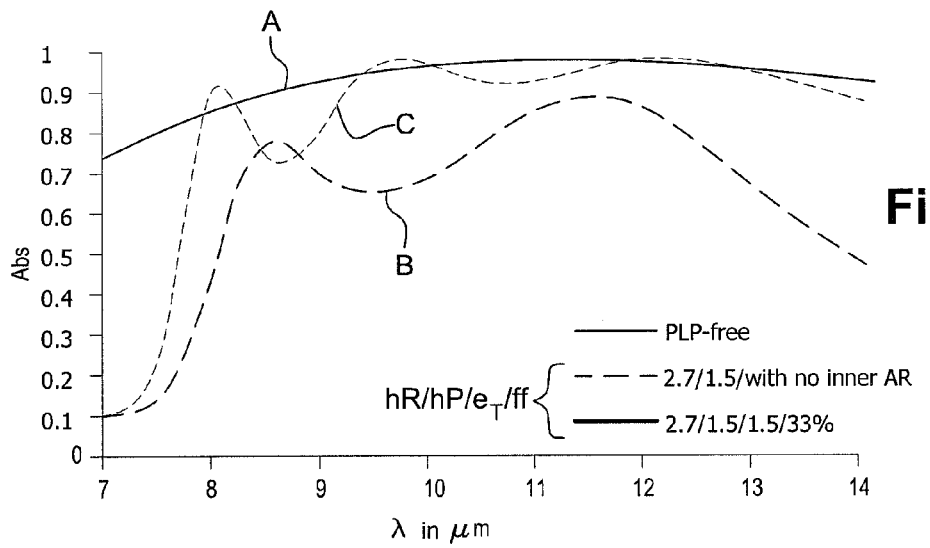
FIG. 10 shows a set of absorption spectrums of a bolometric membrane in the presence of different windows and with no window.

FIG. 10 illustrates this phenomenon, curve A is the spectrum of the absorbance of a sensitive membrane such as described hereabove placed in vacuum at $\lambda_{10}/(4 \cdot n)=2.7$ µm ($\lambda_{10}=11$ µm) above a metal reflector and in the absence of a window, curve B is the absorbance spectrum of this same membrane placed at a 1.5 µm distance from a window formed of a usual a-Si (0.8 µm)+Ge (1.7 µm)+ZnS (1.2 µm) three-layer of the state of the art tuned to $\lambda_{10}=11$ µm, and curve C is the absorbance spectrum of this same membrane placed under a window according to the fifth embodiment such as described hereafter, particularly at a distance from the metal reflector shorter than $\lambda_{10}/4$. Curve A thus represents the "ideal" case where there is no window, and thus no disturbance of the simple Fabry-Perot effect (quarter wave) induced by the presence of the metal reflector. Curve B illustrates this disturbance, the average value of the absorbance of the membrane over the [8; 14 µm] range drops to 73%: according to the state of the art, the absorbance of the membrane is actually much degraded by the proximity of the capsule. Curve C shows that it is possible to obtained a much higher absorbance in the presence of the window, with respect to the case of the state of the art (curve B), by jointly adjusting the refraction index and the optical thickness of the first optical structure of the window, the average absorbance in the [8; 14 µm] range being in this case equal to 93%, without modifying, to begin with, the distance between the membrane and the reflector (2.7 µm) and the distance between the membrane and the window (1.5 µm).

A method of manufacturing a detector with an optimizing placing of a sensitive membrane such as described in a hermetic vacuum package comprises:

a. determining the second and third optical structures of the window, for example, a Ge+antireflection ZnS bilayer of the state of the art or such as described in the previously-described embodiments;

b. determining the variation of the absorbance of the membrane according to the optical thickness and the refraction index of the first optical structure of the window and to the distances between the membrane and the metal reflector and the first optical structure of the window. This determination may for example be carried out by digital simulation by means of software such as "Diffract-MOD™" of Synopsis, Inc. (www.rsoftdesign.com) or of the "VirtualLab™" of Light Trans Gmbh. (www.lighttrans.com), particularly module "Grating Toolbox" concerning a first textured optical structure;

c. determining the ranges of values for the index and/or the distances while taking into account the manufacturing or operating constraints, for example, a minimum distance between the membrane and the window, a period and a filling factor concerning a first textured optical structure (if used) compatible with a monolithic manufacturing technique, etc.;

d. selecting from the determined ranges the quadruplet (geometric thickness, refraction index or features of the structured network (period p, factor ff coupled to index n of the filling material), distance to the reflector, distance to the first optical structure of the window) inducing an average absorbance of the membrane in the [8-14 µm] range greater than the absorbance of the state of the art, particularly an absorbance greater than 90%, advantageously greater than 95%;

e. manufacturing the detector having the selected values.

The manufacturing of the membrane and of the window differs from the previous embodiments by precisions on the preferred thickness of sacrificial layers 22 and 24 which enable to set the distances between sensitive membrane 12 and, on the one hand, the reflector formed on substrate 10 and on the other hand window 20, and by precisions in terms of effective index of the first optical structure or the features of the grating, if it is used to construct it.

In a first variation, the first optical structure is made of CVD a-Si textured similarly to the third previously-described embodiment, filling factor ff of the CVD a-Si patterns and their depth $e_T$ enabling to respectively set the equivalent (effective) refraction index and the optical thickness of the first optical structure. The manufacturing then for example comprises, for a detection in the [8; 14 µm] range, selecting:

period p of the pattern grating smaller than or equal to $\Delta_{10}3$ (for example, 3.5 µm for $\lambda_{10}=11$ µm) to avoid diffraction losses in the band of interest, preferably greater than or equal to 1.5 µm to avoid uselessly constraining the forming of the patterns, and preferably smaller than or equal to 3 µm to obtain an optimal absorption (>95%) on the [8; 14 µm] band. The texturing is preferably carried out according to a high symmetry in the horizontal plane at least of order two, to provide an operation insensitive to the polarization of light, the shape of the elementary patterns being of little importance (squares, disks, hexagons, . . . ). The final texturing (after completion of the process) is for example a CVD a-Si grid or a CVD a-Si grating of pads;

window-to-membrane distance hP between 1 µm and 3 µm for mechanical reasons (for example, greater than or equal to 1 µm to avoid a contact between the window and the membrane and smaller than or equal to 3 µm to ease the forming of the mechanical supports of the window);

membrane-to-reflector distance hR, grating etch depth $e_T$ (actually equivalent in this configuration to geometric thickness $e_1$ of the first optical structure) and CVD a-Si filling factor ff of the grating according to distance hP selected by means of the charts such as illustrated in FIGS. 11A-11F to obtain an average absorption in the [8; 14 µm] range greater than or equal to 95%. In particular, for a grating of square patterns of edge a of CVD a-Si, ff=(a/p)$^2$, while for a a-Si grid pierced with square holes of edge a, ff=1−(a/p)$^2$.

Figure 11A:
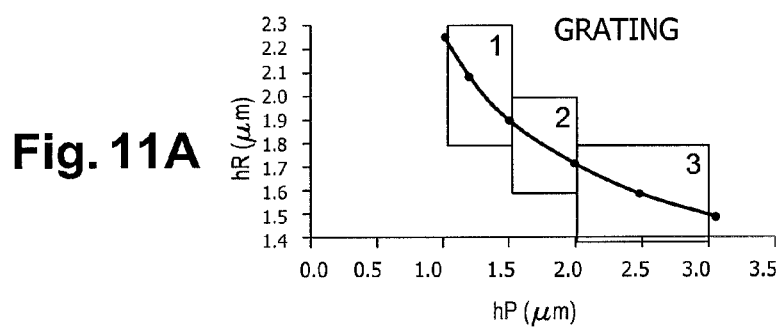
FIGS. 11A to 11F are charts connecting the different design parameters to obtain an absorption in the membrane greater than 90%.
Figure 11B:
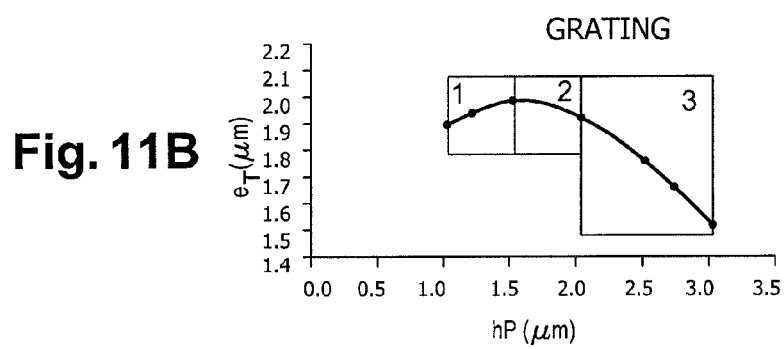
Figure 11C:
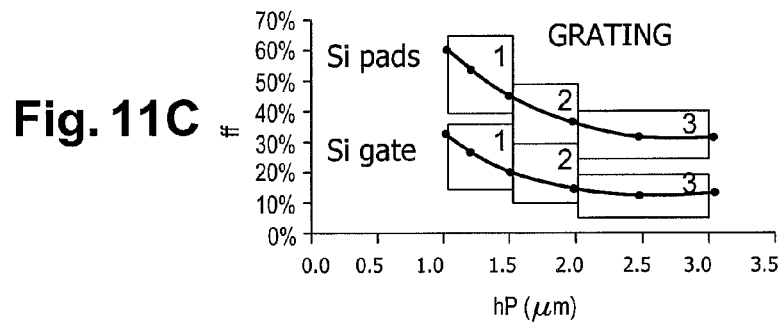

In particular, to obtain an absorption greater than 95%, the parameters of the following table are used for a pad or grid-shaped grating, the lines numbered 1, 2, and 3 respectively corresponding to the ranges numbered 1, 2, and 3 of FIGS. 11A to 11C:

|   |   |   |   | pads | grids |
|---|---|---|---|------|-------|
| 1 | 1.0 μm < hP < 1.5 μm | 1.8 μm < hR < 2.3 μm | 1.8 μm < $e_T$ < 2.1 μm | 40% < ff < 65% | 15% < ff < 35% |
| 2 | 1.5 μm < hP < 2.0 μm | 1.6 μm < hR < 2.0 μm | 1.8 μm < $e_T$ < 2.1 μm | 30% < ff < 50% | 10% < ff < 25% |
| 3 | 2.0 μm < hP < 3.0 μm | 1.4 μm < hR < 1.8 μm | 1.5 μm < $e_T$ < 2.1 μm | 25% < ff < 40% | 5% < ff < 20% |

The ranges of filling factors ff of the grating disclosed in the above table for a CVD amorphous silicon pad or grid-shaped grating respectively correspond to the 1.45-1.80, 1.35-1.60, 1.30-1.50 ranges of effective refraction indexes.

Figure 11D:
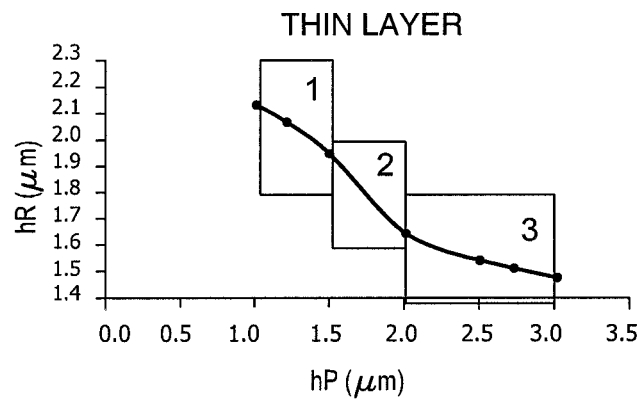
Figure 11E:
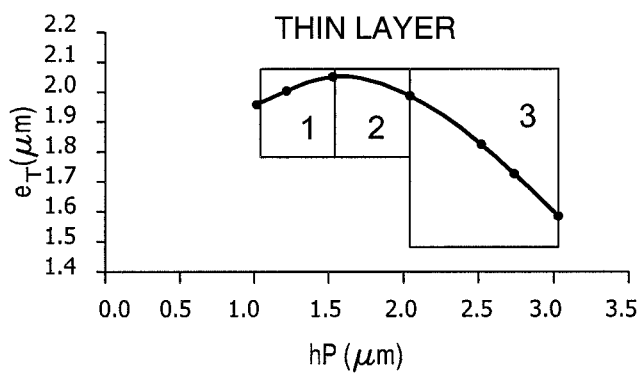
Figure 11F:
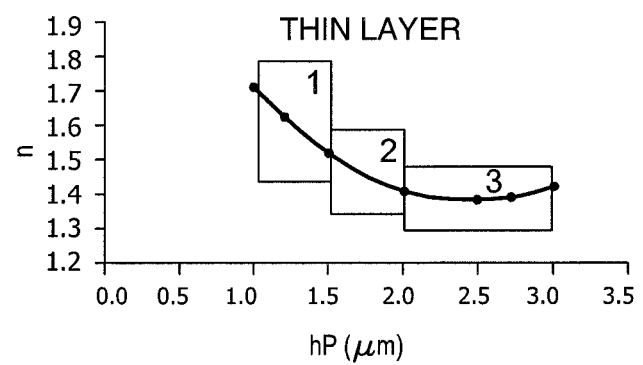

To obtain an absorption greater than 95%, the parameters of the following table are used for a first non-structured optical layer, the lines numbered 1, 2, and 3 respectively corresponding to the ranges numbered 1, 2, and 3 of FIGS. 11D to 11F and $e_1$ being the geometric thickness of the first optical layer and $n_{eq}^1$ being the equivalent refraction index thereof:

| 1 | 1.0 μm < hP < 1.5 μm | 1.8 μm < hR < 2.3 μm | 1.8 μm < $e_1$ < 2.1 μm | 1.45 < $n_{eq}^1$ < 1.80 |
| 2 | 1.5 μm < hP < 2.0 μm | 1.6 μm < hR < 2.0 μm | 1.8 μm < $e_1$ < 2.1 μm | 1.35 < $n_{eq}^1$ < 1.60 |
| 3 | 2.0 μm < hP < 3.0 μm | 1.5 μm < hR < 2.1 μm | 1.5 μm < $e_1$ < 2.1 μm | 1.30 < $n_{eq}^1$ < 1.50 |

It should in particular be noted in the chart of FIG. 11A that distance hR between the membrane and the metal reflector of the substrate is much shorter than $\lambda_{10}/4 = 0.25 \cdot \lambda_{10}$, since it is at most equal to 2.25 μm while $0.25 \cdot \lambda_{10} = 2.7$ μm for $\lambda_{10} = 11$ μm. Particularly, for hP=1.5 μm, which is a usual distance of the state of the art, distance hR between the membrane and the metal reflector is equal to 1.9 μm.

Figure 12A:
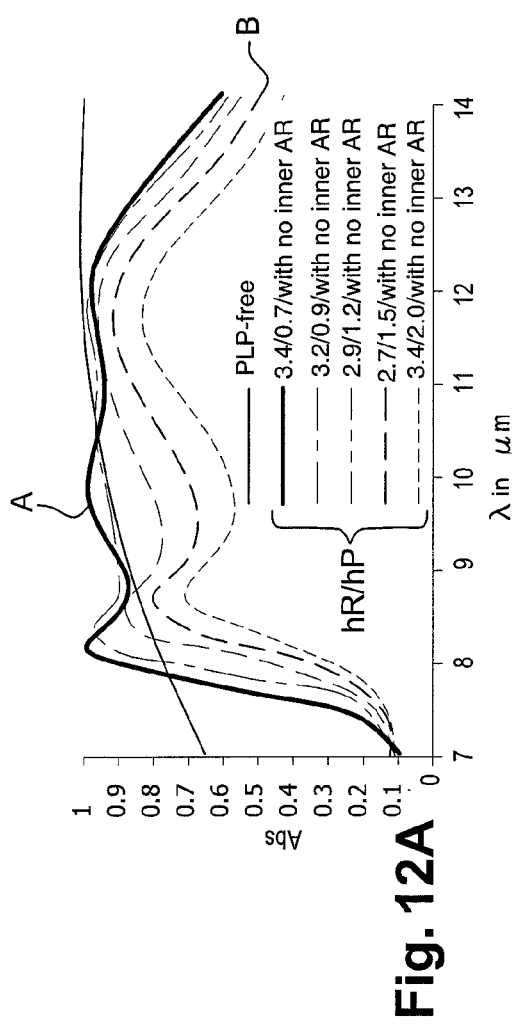
FIGS. 12A to 12C illustrate different absorption spectrums in the membrane according to different values of the design parameters.

FIG. 12A illustrates the absorption in the membrane according to the wavelength, for different values of the hR/hP pair, for the configuration of the state of the art (CVD a-Si+Ge+ZnS three-layer window). The optimization with no constraints relative to hP and hR provides values hR=3.4 μm and hP=0.7 μm (curve A), with an integrated absorption over [8; 14 μm] of 89%. When hP is constrained to take increasingly high values (0.9, 1.2, 1.5, and 2.0 μm) to take into account the precaution of keeping a distance between the membrane and the window, the optimal value of hR decreases, as well as the average absorption. Case hP=1.5 μm/hR=2.7 μm=$0.25 \cdot \lambda_{10}$ corresponds to the configuration of the state of the art (average absorption=73%, curve B).

It can thus be observed that in this configuration, the absorption in the membrane is penalized not only by the absence of a lower antireflection (that is, an equivalent refraction index of the first optical structure adapted to the package vacuum), but also by the constraint of keeping a distance between the window and the membrane.

Figure 12B:
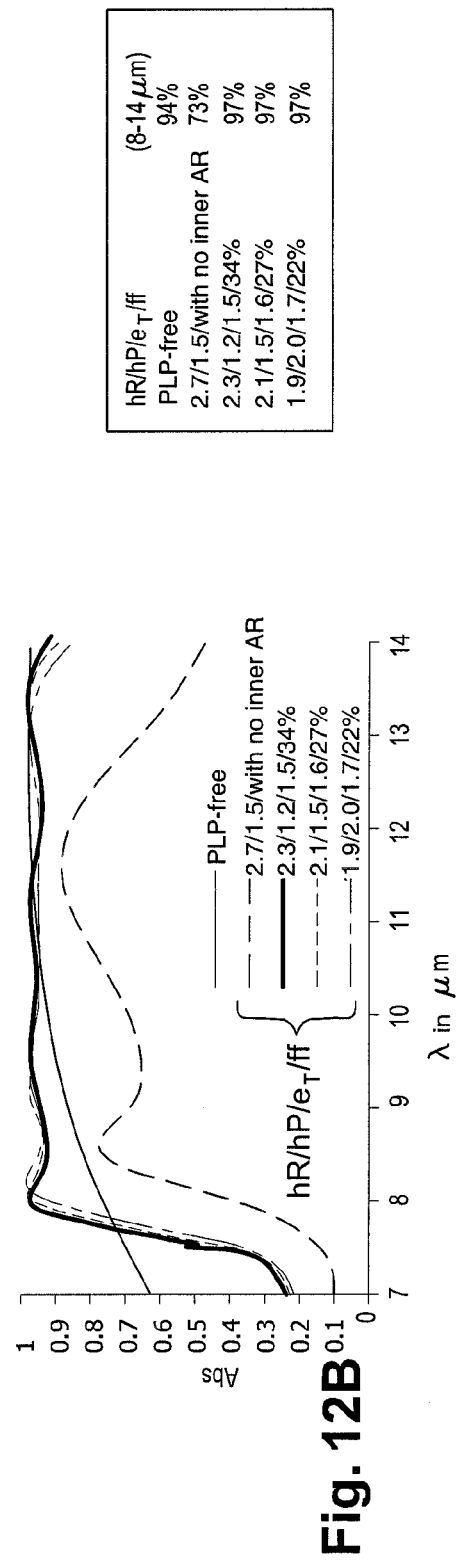

FIG. 12B illustrates spectral responses optimized in terms of absorbance with a first textured optical structure on the lower surface of the window according to an a-Si grid. Period p of the grating is set to 2 μm. The optimal values of parameters hR, hP, $e_T$, and ff determined with no constraints are respectively equal to 2.3 μm, 1.2 μm, 1.5 μm, and 34%. The aspect ratio of the grating (defined by parameter $e_T/(p-a)$, that is, the ratio of the depth to the smallest lateral dimension of the patterns) is 4. The corresponding optimal absorption is 97% over the [8; 14 μm] range. The optimal value of hP (1.2 μm) is within the range of acceptable values to avoid the mechanical contact, conversely to the configuration deprived of a first optical structure. The absorption with the parameters accessible in practice is improved for two reasons: the introduction of the inner antireflection in the form of a first optical structure of adapted index, and the fact that the optimal window-to-membrane distance (hP) is greater, while remaining within the range of technologically convenient values.

Figure 12C:
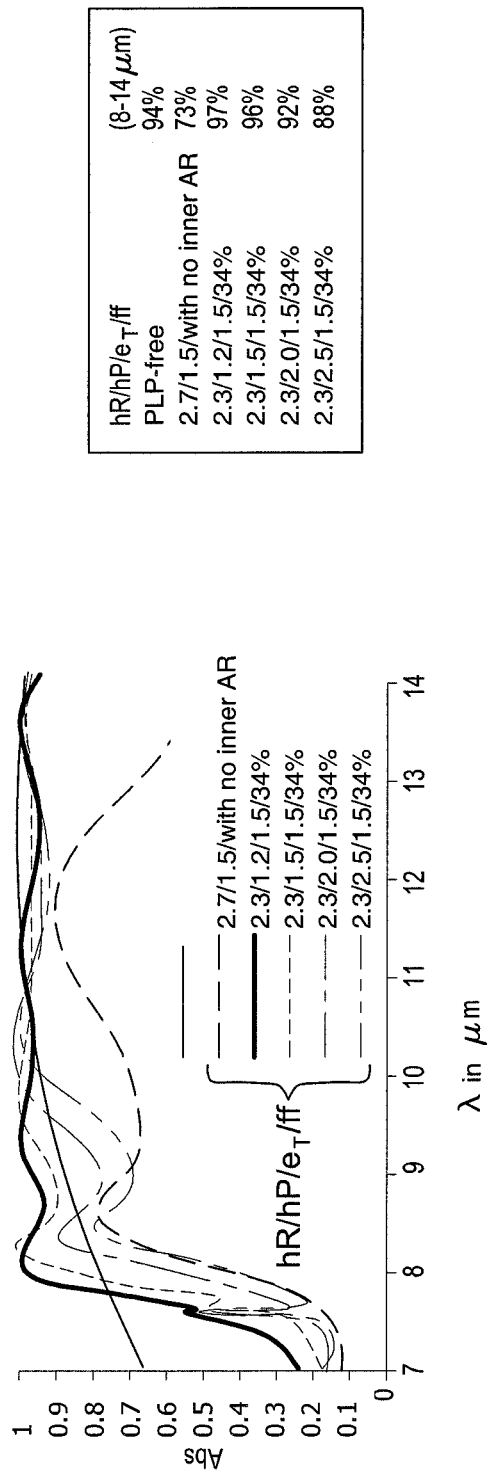

It is possible to further increase distance hP while keeping a very high absorption, with a simultaneous decrease of distance hR, and an increase of the aspect ratio of the grating (FIG. 12B). Increasing distance hP with no readjustment of hR and of the grating parameters results in a less favorable integrated absorption (FIG. 12C). It is indispensable to simultaneously size the two sacrificial layers 22 and 24 to optimize the absorption.

It should be noted that the absorption in the membrane may be slightly greater than the so-called "ideal" configuration, that is, with no capsule-window, or with a thick window assumed to be perfectly transparent, very distant, and treated with an antireflection assumed to be perfect on both its surfaces; indicated as "PLP-free" in the drawings. This observation can be explained by the fact that the most complex interferences of the complete stack of the encapsulated device may be expressed favorably by keeping the membrane within a lobe of strong amplitude in the area below 10 μm, where the membrane alone is well below 100% of absorption as indicated in FIG. 10A.

To ease the technological forming of the grating, it may be preferred to decrease etch depth $e_T$ to decrease the aspect ratio and ease the conformal filling of the depressions during the deposition of the filling material(s), particularly if a PECVD-type method is used. The optimization of the absorption, for a limited etch depth, appears to result in a filling factor which is also more favorable, towards values closer to 50%. The aspect ratio is equally favorably modified. The average absorption is somewhat degraded as compared with the case where the etch depth is not limited, but remains much greater than the case of the reference capsule with no internal antireflection. For an etch depth $e_T$ limited to 1 μm at its upper limit (and hP limited to 1.2 μm at its lower limit), the optimal width of the pads etched in the sacrificial layer is 1.4 μm, which provides a 50% filling factor and an etching aspect ratio of 1.6. The average absorption over the [8; 14 μm] range then is 92%, that is, a value still much greater than the 73% of the state of the art. The optimal distance hR is 2.5 μm, a little greater than for the etching at a 1.5-μm depth, but similar to the standard of the field of microbolometers, which is an additional advantage of this variation.

For an etch depth $e_T$ limited to 0.5 µm at its upper limit (and hP limited to 1.2 µm at its lower limit), the optimal parameters are ff=67%, hR=2.8 µm, but the average absorption of 84%, is placed even more than 10 points above the reference.

In a second variation, the first optical structure is non-textured. The manufacturing then for example comprises, for a detection in the [8; 14 µm] range, selecting:

window-to-membrane distance hP between 1 µm and 3 µm for the already-discussed mechanical reasons;

membrane-to-reflector distance hR, geometric thickness $e_1$ of the first optical structure, and equivalent index $n_{eq}^1$ of this first optical structure according to the distance hP selected by means of the charts such as illustrated in FIGS. 11A-F to obtain an average absorption in the [8; 14 µm] range greater than or equal to 95%.

The invention claimed is:

1. A method of manufacturing a detector capable of detecting a wavelength within a range of 8 µm to 14 µm, which includes a central wavelength of $\lambda_{10}$, the detector comprising a detection device capable of detecting said range and a hermetic package under a predetermined pressure having said device housed therein, said package being formed of a substrate, of lateral walls attached to the substrate and of an upper cap attached to the lateral walls and comprising a portion vertically in line with the device which is transparent in said range, the method comprising:

forming said device on the substrate, said forming comprising depositing a sacrificial layer totally embedding said device;

forming the cap on the sacrificial layer, said cap being formed of a stack of first, second, and third optical structures transparent in said range, the second and third optical structures having equivalent refraction indexes at wavelength $\lambda_{10}$ respectively greater than or equal to 3.4 and smaller than or equal to 2.3;

after the forming of a portion of the cap comprising at least the first optical structure, forming a vent of access to the sacrificial layer through said portion of the cap, and then applying, through the vent, an etching to totally remove the sacrificial layer, wherein the optical thickness of the first optical structure is greater than or equal to $\lambda_{10}/10$;

wherein the equivalent refraction index $n_{eq}^1$ at wavelength $\lambda_{10}$ of the first optical structure is smaller than or equal to 2.6; and wherein the surface of the first optical structure formed on the sacrificial layer is inert to the etching implemented to remove the sacrificial layer.

2. A method of manufacturing the detector of claim 1, wherein the forming of the first optical structure on the sacrificial layer comprises:

depositing a first layer of material on the sacrificial layer, the first layer being entirely made of a material inert to the etching; and forming a second layer of material on the first layer; and wherein the thicknesses and the equivalent refraction indexes at wavelength $\lambda_{10}$ of the first layer and of the second layer verify relation:

$$\frac{n_{s1} \cdot e_{s1} + n_{s2} \cdot e_{s2}}{e_{s1} + e_{s2}} \leq 2.6$$

in which expression:

$n_{s1}$ and $n_{s2}$ respectively are the equivalent refraction indexes at wavelength $\lambda_{10}$ of the first layer and of the second layer; and $e_{s1}$ and $e_{s2}$ respectively are the geometric thicknesses of the first layer and of the second layer.

3. The detector manufacturing method of claim 2, wherein the second layer of the first optical structure is entirely made of zinc sulfide (ZnS).

4. The detector manufacturing method of claim 1, wherein the etching is an etching based on hydrofluoric acid vapor (HFv); and wherein the material inert to the etching is amorphous silicon (a-Si) or amorphous carbon (a-C) or an amorphous alloy of carbon (C) and of silicon (Si) of a-$Si_xC_{(1-x)}$ type, or an amorphous alloy of silicon (Si) and of germanium (Ge) of a-$Si_xGe_{(1-x)}$ type, where 0<x<1.

5. The detector manufacturing method of claim 1, wherein the etching is a dry oxidizing etching; and wherein the material inert to the etching is amorphous silicon (a-Si) or an amorphous alloy of carbon (C) and of silicon (Si) of a-$Si_xC_{(1-x)}$ type where 0.05<x<1, or an amorphous alloy of silicon (Si) and of germanium (Ge) of a-$Si_xGe_{(1-x)}$ type, where 0≤x<1.

6. The detector manufacturing method of claim 1, wherein the forming of the first optical structure further comprises forming a periodic grating of depressions in the sacrificial layer, the pitch or the period of the periodic grating being smaller than $$\frac{\lambda_{10}}{3},$$

the forming of the first optical structure resulting in at least partially filling the depressions of said grating.

7. The detector manufacturing method of claim 1, wherein the first optical structure has an optical thickness $e_1$ verifying relation:

$$e_1 = \frac{\lambda_{10}}{4}$$

8. The detector manufacturing method of claim 1, wherein the second optical structure is entirely made of (Ge) or of a stack of a layer of amorphous silicon (a-Si) and of a layer of germanium (Ge).

9. The detector manufacturing method of claim 1, wherein the second optical structure has an optical thickness $e_2$ verifying relation:

$$e_2 = p_2 \times \frac{\lambda_{10}}{4}$$

in which expression $p_2$=1, 2 or 4.

10. The detector manufacturing method of claim 1, wherein the third optical structure is entirely made of zinc sulfide.

11. The detector manufacturing method of claim 1, wherein the third optical structure is entirely made of an amorphous alloy of carbon (C) and of silicon (Si) of a-$Si_xC_{(1-x)}$ type, where 0<x<1, particularly x≤0.4.

12. The detector manufacturing method of claim 1, wherein the third optical structure is directly formed by the etching of a periodic grating of depressions into the thickness of the materials forming the second optical structure.

13. The detector manufacturing method of claim 12, wherein it comprises depositing a layer of an alloy of amorphous carbon (C) and of silicon (Si) of a-Si$_x$C$_{(1-x)}$, type, where 0<x<1, on the periodic grating of depressions, particularly x≤0.4.

14. The detector manufacturing method of claim 13, wherein x≥0.05.

15. The detector manufacturing method of claim 1, wherein the third optical structure is at least partly formed by the etching of a periodic grating of depressions into at least one layer made of an alloy of a-Si$_x$C$_{(1-x)}$, or a-Si$_x$Ge(1−x) type, where 0<x<1, particularly x≤0.4.

16. The detector manufacturing method of claim 1, wherein the third optical structure has an optical thickness e$_3$ verifying relation:

$$e_3 = \frac{\lambda_{10}}{4}$$

17. The detector manufacturing method of claim 1, wherein the total geometric thickness of the first, second, and third optical structures is smaller than or equal to $$\frac{\lambda_{10}}{2}.$$

18. The detector manufacturing method of claim 1, wherein the detection device comprises at least one bolometric membrane capable of absorbing part of the radiation in said range and suspended above a metal reflector, the method comprising:
- determining variations of the absorbance of said membrane according to said optical structure of said window;
- determining ranges of values for the equivalent refraction index n$_{eq}^1$ of the first optical structure of the window, the distance between the bolometric membrane and the metal reflector and/or the distance between the bolometric membrane and the window while taking into account manufacturing and/or operating constraints; and
- selecting, in said determined ranges, a quadruplet inducing an average absorbance greater than 90% of said membrane in said range;
- said quadruplet comprising at least the geometric thickness, the equivalent refraction index n$_{eq}^1$ of the first optical structure of the window, the distance between the bolometric membrane and the metal reflector, and the distance between the bolometric membrane and the window.

19. The detector manufacturing method of claim 18, wherein the forming of the first optical structure comprises forming a periodic grating of patterns in its surface in contact with the sacrificial layer, and the grating thickness, the filling factor, and the grating period, the distance between the membrane and the metal reflector, and the distance between the membrane and the cap are selected to set the average absorption of the membrane in said range to a value greater than 90%.

20. The detector manufacturing method of claim 19, wherein the patterns of the grating form pads or a grid of amorphous silicon (a-Si), the refraction index of amorphous silicon (a-Si) being in the range from 0.9×3.4, to 1.1×3.4, the period of the grating being in the range from 1 to 3 micrometers, and in that:
- distance hP between the membrane and the cap is in the range from 1 micrometer to 1.5 micrometer;
- distance hR between the membrane and the reflector is in the range from 1.8 micrometer to 2.3 micrometers;
- depth e$_T$ of the grating pads is in the range from 1.8 micrometer to 2.1 micrometers; and
- filling factor ff of the grating of pads is in the range from 40% to 65% or filling factor ff of the grid is in the range from 15% to 35%.

21. The detector manufacturing method of claim 20, wherein the bolometric membrane is formed of a titanium nitride layer (TiN) having a 380-Ohm/square sheet resistance, a 8-nanometer thickness, and optical indexes n=10.5 and k=16 at a 10 μm wavelength; and having an amorphous silicon layer (a-Si) with a 200-nanometer thickness and optical indexes n=3.42 and k=0 at a 10 μm wavelength, deposited thereon.

22. The detector manufacturing method of claim 19, wherein the patterns of the grating form pads or a grid of amorphous silicon (a-Si), the refraction index of amorphous silicon (a-Si) being in the range from 0.9×3.4, to 1.1×3.4, the period of the grating being in the range from 1 to 3 micrometers, and in that:
- distance hP between the membrane and the cap is in the range from 1.5 micrometer to 2 micrometers;
- distance hR between the membrane and the reflector is in the range from 1.6 micrometer to 2 micrometers;
- depth e$_T$ of the grating pads is in the range from 1.8 micrometer to 2.1 micrometers; and
- filling factor ff of the grating of pads is in the range from 30% to 50% and filling factor ff of the grid is in the range from 10% to 25%.

23. The detector manufacturing method of claim 19, wherein the patterns of the grating form pads or a grid of amorphous silicon (a-Si), the refraction index of amorphous silicon (a-Si) being in the range from 0.9×3.4, to 1.1×3.4, the period of the grating being in the range from 1 to 3 micrometers, and in that:
- distance hP between the membrane and the cap is in the range from 2 micrometers to 3 micrometers;
- distance hR between the membrane and the reflector is in the range from 1.4 micrometer to 1.8 micrometer;
- depth e$_T$ of the grating pads is in the range from 1.5 micrometer to 2.1 micrometers; and
- filling factor ff of the grating of pads is in the range from 25% to 40% and filling factor ff of the grid is in the range from 5% to 20%.

24. The detector manufacturing method of claim 19, wherein said first optical structure is formed of one or a plurality of non-structured layers of material, and wherein:
- distance hP between the membrane and the cap is in the range from 1 micrometer to 1.5 micrometer;
- distance hR between the membrane and the reflector is in the range from 1.8 micrometer to 2.3 micrometers;
- geometric thickness e$_1$ of the first optical layer is in the range from 1.8 micrometer to 2.1 micrometers; and
- equivalent refraction index n$_{eq}^1$ of the first optical layer is in the range from 1.45 to 1.80.

25. The detector manufacturing method of claim 19, wherein said first optical structure is formed of one or a plurality of non-structured layers of material, and wherein:
- distance hP between the membrane and the cap is in the range from 1.5 micrometer to 2.0 micrometers;

distance hR between the membrane and the reflector is in the range from 1.6 micrometer to 2.0 micrometers;

geometric thickness $e_1$ of the first optical layer is in the range from 1.8 micrometer to 2.1 micrometers; and equivalent refraction index $n_{eq}^1$ of the first optical layer is in the range from 1.35 to 1.60.

26. The detector manufacturing method of claim 19, wherein said first optical structure is formed of one or a plurality of non-structured layers of material, and wherein:

distance hP between the membrane and the cap is in the range from 2.0 micrometer to 3.0 micrometer;

distance hR between the membrane and the reflector is in the range from 1.5 micrometer to 2.1 micrometers;

geometric thickness $e_1$ of the first optical layer is in the range from 1.5 micrometer to 2.1 micrometers; and equivalent refraction index $n_{eq}^1$ of the first optical layer is in the range from 1.30 to 1.50.

27. A detector capable of detecting a wavelength within a range of 8 μm to 14 μm, which includes a central wavelength of $\lambda_{10}$, the detector comprising a detection device capable of detecting said range and a hermetic package under a predetermined pressure having said device housed therein, said package being formed of a substrate, of lateral walls attached to the substrate and of an upper cap attached to the lateral walls and comprising a portion vertically in line with the device which is transparent in said range, said cap being formed of a stack of first, second and third optical structures transparent in said range, the second and the third optical structures having equivalent refraction indexes at wavelength respectively greater than or equal to 3.4 and smaller than or equal to 2.3, and wherein;

the optical thickness of the first optical structure is greater than or equal to $\lambda_{10}/10$;

and the equivalent refraction index $n_{eq}^1$ at wavelength $\lambda_{10}$ of the first optical structure is smaller than or equal to 2.6; and wherein the detector is obtained according to the method of claim 1.

28. A detector capable of detecting a wavelength within a range of 8 μm to 14 μm, which includes a central wavelength of $\lambda_{10}$, the detector comprising a detection device capable of detecting said range and a hermetic package under a predetermined pressure having said device housed therein, said package being formed of a substrate, of lateral walls attached to the substrate and of an upper cap attached to the lateral walls and comprising a portion vertically in line with the device which is transparent in said range, said cap being formed of a stack of first, second and third optical structures transparent in said range, the second and the third optical structures having equivalent refraction indexes at wavelength respectively greater than or equal to 3.4 and smaller than or equal to 2.3, and wherein;

the optical thickness of the first optical structure is greater than or equal to $\lambda_{10}/10$;

and the equivalent refraction index $n_{eq}^1$ at wavelength $\lambda_{10}$ of the first optical structure is smaller than or equal to 2.6.

* * * * *